(12) United States Patent
Chiang et al.

(10) Patent No.: US 10,885,254 B2
(45) Date of Patent: *Jan. 5, 2021

(54) INTEGRATED CIRCUIT AND METHOD OF MANUFACTURING SAME

(71) Applicant: TAIWAN SEMICONDUCTOR MANUFACTURING COMPANY, LTD., Hsinchu (TW)

(72) Inventors: Ting-Wei Chiang, New Taipei (TW); Hui-Zhong Zhuang, Kaohsiung (TW); Li-Chun Tien, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/397,064

(22) Filed: Apr. 29, 2019

(65) Prior Publication Data

US 2019/0251225 A1 Aug. 15, 2019

Related U.S. Application Data

(63) Continuation of application No. 15/707,469, filed on Sep. 18, 2017, now Pat. No. 10,296,694, which is a (Continued)

(51) Int. Cl.
*G06F 30/392* (2020.01)
*H01L 27/02* (2006.01)
*H01L 27/092* (2006.01)

(52) U.S. Cl.
CPC ........ *G06F 30/392* (2020.01); *H01L 27/0207* (2013.01); *H01L 27/092* (2013.01)

(58) Field of Classification Search
CPC . G06F 17/5072; G06F 30/392; H01L 27/092; H01L 27/0207
See application file for complete search history.

(56) References Cited

U.S. PATENT DOCUMENTS

| 2005/0022151 A1 | 1/2005 | Rittman et al. |
| 2006/0175637 A1 | 8/2006 | Lee |

(Continued)

FOREIGN PATENT DOCUMENTS

| KR | 10-0667597 | 1/2007 |
| KR | 10-0809717 | 3/2008 |

(Continued)

OTHER PUBLICATIONS

Office Action dated Jul. 18, 2016 from corresponding No. TW 104105380.

(Continued)

*Primary Examiner* — Nha T Nguyen
(74) *Attorney, Agent, or Firm* — Hauptman Ham, LLP

(57) ABSTRACT

A method of manufacturing an integrated circuit includes manufacturing a first set of conductive features by a first mask, positioning a set of gates in a second direction, manufacturing a second set of conductive features by a second mask, and electrically coupling a first portion of the set of gates to a second portion of the set of gates. The first and second set of conductive features is in a first direction and a first layer. The set of gates is in a second layer. The first portion of the set of gates corresponds to a gate terminal of a first n-type transistor, the second portion of the set of gates corresponds to a gate terminal of a first p-type transistor, the first n-type transistor being part of a first transmission gate, and the first p-type transistor being part of a second transmission gate.

20 Claims, 17 Drawing Sheets

Related U.S. Application Data continuation of application No. 14/464,407, filed on Aug. 20, 2014, now Pat. No. 9,767,243.

(60) Provisional application No. 62/003,395, filed on May 27, 2014.

(56) References Cited

U.S. PATENT DOCUMENTS

| | | |
|---|---|---|
| 2008/0010619 A1 | 1/2008 | Yang et al. |
| 2008/0169862 A1 | 7/2008 | Park et al. |
| 2009/0055010 A1 | 2/2009 | Tanaka |
| 2009/0224317 A1* | 9/2009 | Becker ............... G11C 5/06 257/337 |
| 2013/0334613 A1 | 12/2013 | Moroz |
| 2014/0048889 A1* | 2/2014 | Bitterlich ............ H01L 27/0207 257/369 |

FOREIGN PATENT DOCUMENTS

| | | |
|---|---|---|
| TW | 557408 | 10/2003 |
| TW | 200620017 | 6/2006 |
| TW | I322366 | 3/2010 |

OTHER PUBLICATIONS

Office Action dated Dec. 14, 2016 from corresponding application No. DE 10 2014 119 646.5.

Vyacheslav V. Rovner, "Circuit-Layout Co-optimization for Extremely Regular Design Fabrics in Nanoscale ICs", Submitted in partial fulfillment of the requirements for the degree of Doctor of Philosophy, Electrical and Computer Engineering, Carnegie Mellon University Pittsburgh, PA; Dec. 2010; 160 pages.

Office Action dated Jun. 15, 2016 and English translation from corresponding application No. KR 10-2015-0020228.

* cited by examiner

INTEGRATED CIRCUIT AND METHOD OF MANUFACTURING SAME

PRIORITY CLAIM

The present application is a continuation of U.S. application Ser. No. 15/707,469, filed Sep. 18, 2017, now U.S. Pat. No. 10,296,694, issued May 21, 2019, which is a continuation of U.S. application Ser. No. 14/464,407, filed Aug. 20, 2014, now U.S. Pat. No. 9,767,243, issued Sep. 19, 2017, which claims priority to U.S. Provisional Application No. 62/003,395, filed May 27, 2014, the disclosures of which are incorporated herein by reference in their entireties.

BACKGROUND

Integrated circuits (ICs) are often designed with active devices such as transistors, resistors and capacitors connected by conductive traces, such as metal lines and polysilicon lines, to form circuits. The active devices in ICs are formed by a photolithographic process that includes use of photoresists, photolithographic masks (masks), specialized light sources and various etchants. Increasingly dense ICs have numerous benefits in terms of speed, functionality and cost, but cause increasingly difficult design and fabrication problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
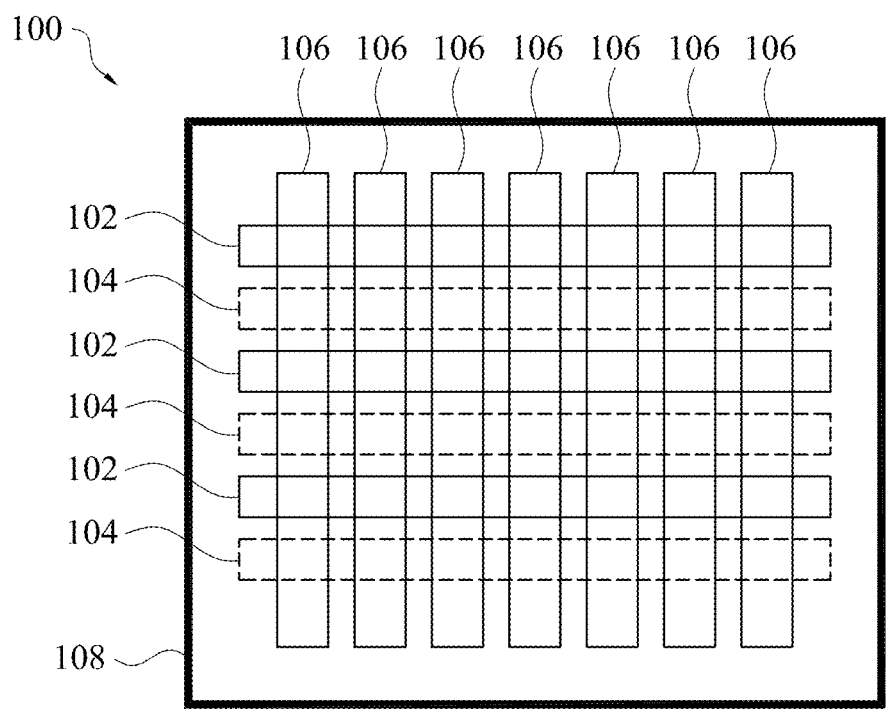
FIG. 1A is a diagram of a double patterned cell with a horizontal conductive trace orientation in a layout design for integrated circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over time, increasingly dense ICs incorporating progressively smaller physical dimensions have correspondingly made many aspects of IC design and fabrication difficult or even impossible with prior methods. In some embodiments, improved IC design and fabrication methods include a system and method of layout design for ICs that increase packing efficiency of conductive traces, such as metal lines in metal layers created by BEOL processes.

The IC fabrication process is often considered to include a front-end-of-line (FEOL) portion, a middle-end-of-line (MEOL) portion, also called a Middle-Of-The-Line (MOL) portion, and a back-end-of-line (BEOL) portion. FEOL is the first portion of IC fabrication wherein individual active devices are patterned on a semiconductor wafer. FEOL processes include: selecting the type of semiconductor wafer to be used; chemical-mechanical planarization and cleaning of the wafer; shallow trench isolation (STI); well formation, gate module formation, and source and drain creation. FEOL does not include the deposition of metal interconnect layers. MEOL processes occur after FEOL processes and include gate contact formation and under bump metallization (UBM) processes.

BEOL is the final portion of the IC fabrication process where the individual devices (transistors, capacitors, resistors, etc.) are interconnected with vias and conductive traces, e.g., metal lines. BEOL generally begins when the first layer of metal is deposited and includes contacts, insulating layers (dielectrics), metal levels, and bonding sites for chip-to-package connections. In some embodiments, ten or more metal layers are added in the BEOL portion.

In some embodiments, the system and method of layout design for ICs increases packing efficiency of conductive traces, such as metal lines in metal layers created by BEOL processes, by routing all metal lines in one direction on each metal layer. Routing all metal lines in one direction on each metal layer enables greater packing density through a more efficient packing of conductive traces. Routing all metal lines in one direction also makes it possible to relax pitch requirements between conductive traces, as set forth by one or more design rules, because metal structures having metal lines routed in one direction have a regular pattern that reduces the risk of manufacturing or process errors. In some embodiments, a double patterning process creates sets of metal lines all oriented in a single direction.

FIG. 1A is a diagram of a double patterned cell with a horizontal conductive trace orientation in a layout design for integrated circuits 100, in accordance with some embodiments. A first set of conductive traces 102 is oriented in a single direction. In some embodiments, the first set of conductive traces 102 is oriented in a horizontal direction with respect to the page orientation. In some embodiments, the conductive traces in the first set of conductive traces 102 are parallel metal lines in the same metal layer. As used herein the term "line" includes one or more line segments. The first set of conductive traces 102 is formed by photolithographic techniques using a first mask. Pitch is the spacing between repeating portions of adjacent conductive traces, such as similarly, repetitively positioned corners of adjacent conductive traces. The first mask, and correspondingly, the first set of conductive traces 102, has a predetermined pitch.

A second set of conductive traces 104 is oriented in the same direction as the first set of conductive traces 102. In some embodiments, the second set of conductive traces 102 is oriented in a horizontal direction. In some embodiments, the conductive traces in the second set of conductive traces 104 are parallel metal lines in the same metal layer. The second set of conductive traces 102 is formed by photolithographic techniques using a second mask. The second mask, and correspondingly, the second set of conductive traces 104, has a predetermined pitch. In some embodiments, the pitch of the first mask and the pitch of the second mask are the same. Furthermore, the second mask is positioned such that the second mask is offset with respect to the first mask by less than the pitch for the first set of conductive traces 102. Together, the first set of conductive traces 102 and the second set of conductive traces 104 are formed by double patterning. Double patterning is the formation of features on a layer with two offset masks to create features smaller than a pitch of either mask. Double patterning is performed in the fabrication of ICs to increase the density of features patterned by the masks beyond that enabled by layers formed with a single mask.

A set of metal-like defined (MD) conductive traces 106 in an MD layer is formed during the MEOL portion of the IC fabrication process. In some embodiments, the set of MD conductive traces 106 is conductive, but comprises a greater percentage of nonmetal material compared to metal material. In some embodiments, the set of MD conductive traces 106 is formed of a semiconductor using ion implantation sufficient to convert the semiconductor into a conductor. A double patterned cell 108 includes the set of MD conductive traces 106 formed during the MEOL portion of IC fabrication, and the first set of conductive traces 102 and the second set of conductive traces 104 formed during the BEOL portion of IC fabrication. The cell 108 has one or more active devices formed and electrically connected in the cell.

Figure 1B:
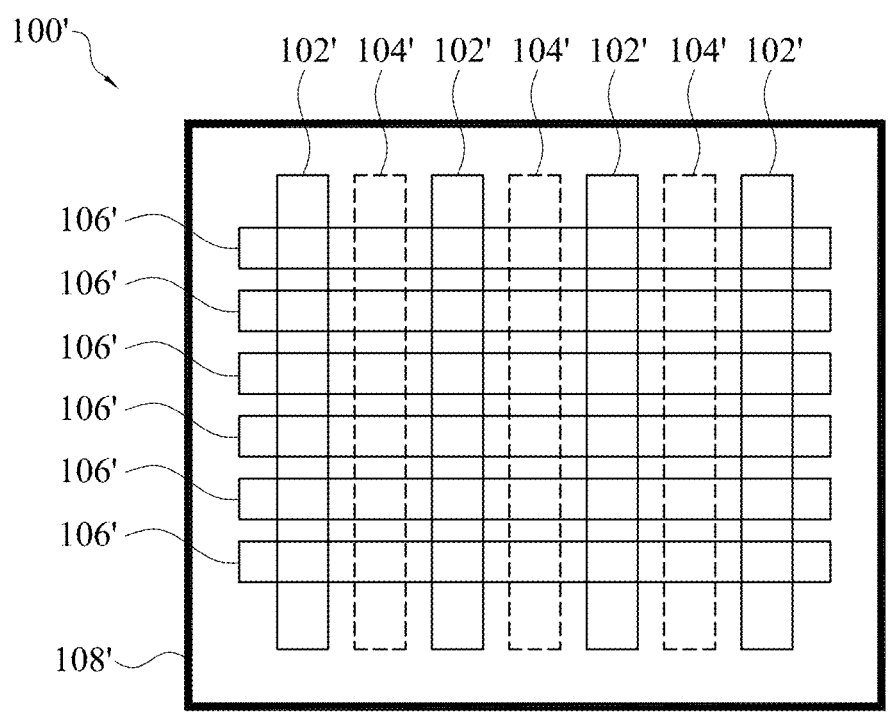
FIG. 1B is a diagram of a double patterned cell with a vertical conductive trace orientation in a layout design for integrated circuits, in accordance with some embodiments.

FIG. 1B is similar to FIG. 1A rotated by 90 degrees. A first set of conductive traces 102' corresponds to the first set of conductive traces 102 (FIG. 1A) rotated 90 degrees, however, there are four conductive traces in FIG. 1B. A second set of conductive traces 104' corresponds to the first set of conductive traces 104 (FIG. 1A) rotated 90 degrees, however, there are three conductive traces 104' in FIG. 1B. A first set of MD conductive traces 106' corresponds to the first set of MD conductive traces 106 (FIG. 1A) rotated 90 degrees, however, there are six MD conductive traces 106' in FIG. 1B. A double patterned cell 108' corresponds to the double patterned cell 108 (FIG. 1A) rotated 90 degrees.

Figure 2A:
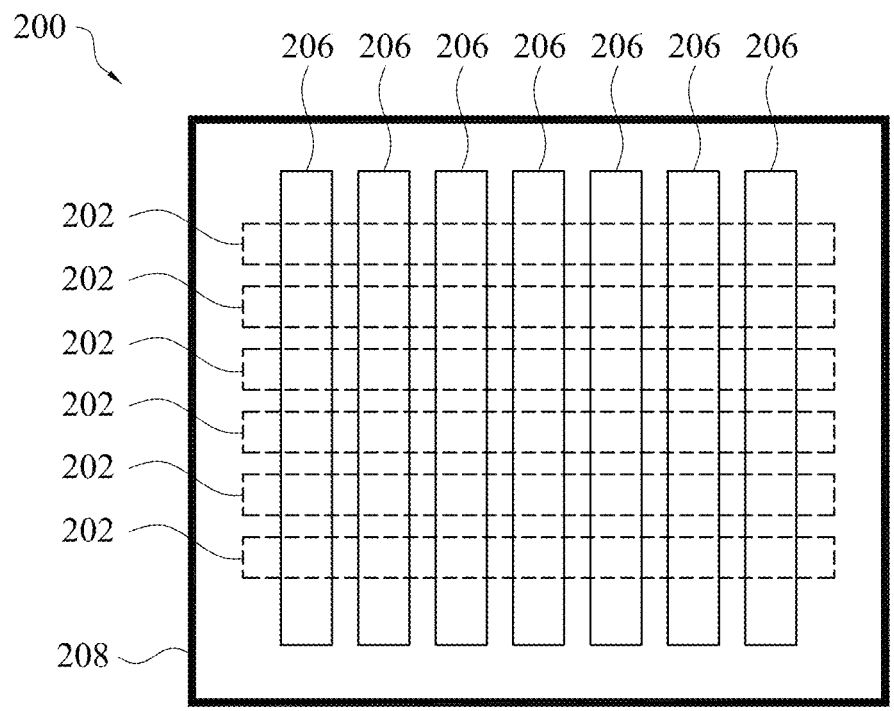
FIG. 2A is a diagram of a single patterned cell with a horizontal conductive trace orientation in a layout design for integrated circuits, in accordance with some embodiments.

FIG. 2A is a diagram of a single patterned cell with a horizontal conductive trace orientation in a layout design for integrated circuits 200, in accordance with some embodiments. A set of conductive traces 202 is oriented in a single direction. In some embodiments, the set of conductive traces 202 is oriented in a horizontal direction. In some embodiments, the conductive traces in the set of conductive traces 202 are parallel metal lines in the same metal layer. In some embodiments, a number of the conductive traces in the set of conductive traces 202 is greater than 4. The set of conductive traces 202 is formed by photolithographic techniques using a mask having a predetermined pitch. The set of conductive traces 202 is formed by single patterning. Single patterning is the formation of features on a layer with one mask. Conductive traces formed by single patterning typically have lower densities than conductive traces formed by double patterning.

A set of MD conductive traces 206 in an MD layer is formed during the MEOL portion of the IC fabrication process. In some embodiments, the set of MD conductive traces 206 is conductive, but comprises a greater percentage of nonmetal material compared to metal material. In some embodiments, the set of MD conductive traces 206 is formed of a semiconductor using ion implantation sufficient to convert the semiconductor into a conductor. A single patterned cell 208 includes the set of MD conductive traces 206 formed during the MEOL portion of IC fabrication, and the set of conductive traces 202 formed during the BEOL portion of IC fabrication. The cell 208 has one or more active devices formed and electrically connected in the cell.

Figure 2B:
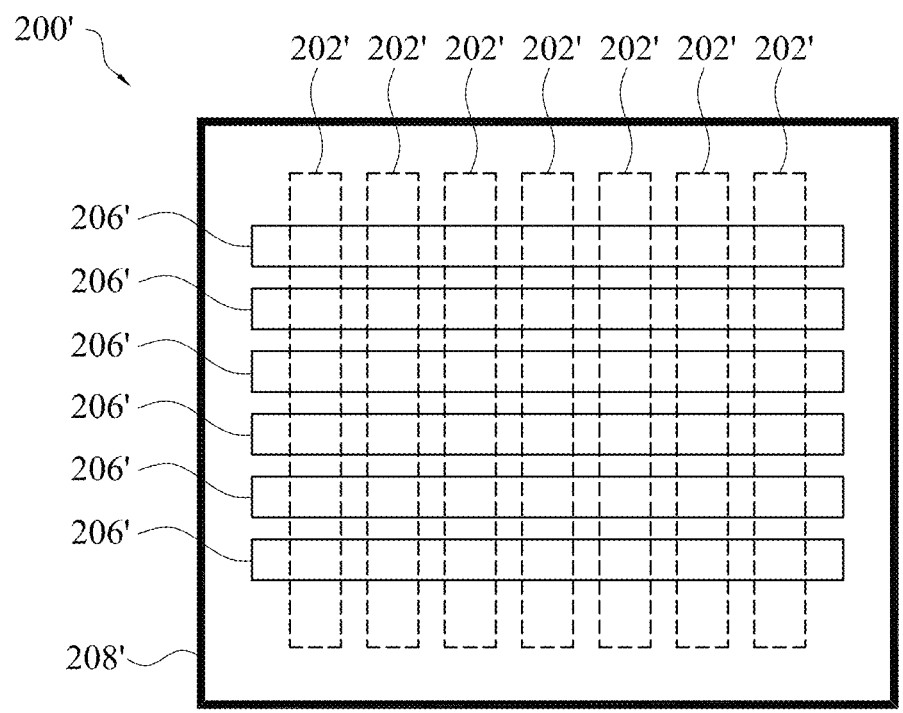
FIG. 2B is a diagram of a single patterned cell with a vertical conductive trace orientation in a layout design for integrated circuits, in accordance with some embodiments.

FIG. 2B is similar to FIG. 2A rotated by 90 degrees. A first set of conductive traces 202' corresponds to the first set of conductive traces 202 (FIG. 2A) rotated 90 degrees, however, there are seven conductive traces in FIG. 2B. A first set of MD conductive traces 206' corresponds to the first set of MD conductive traces 206 (FIG. 2A) rotated 90 degrees, however, there are six MD conductive traces 206' in FIG. 2B. A double patterned cell 208' corresponds to the double patterned cell 208 (FIG. 2A) rotated 90 degrees.

Figure 3A:
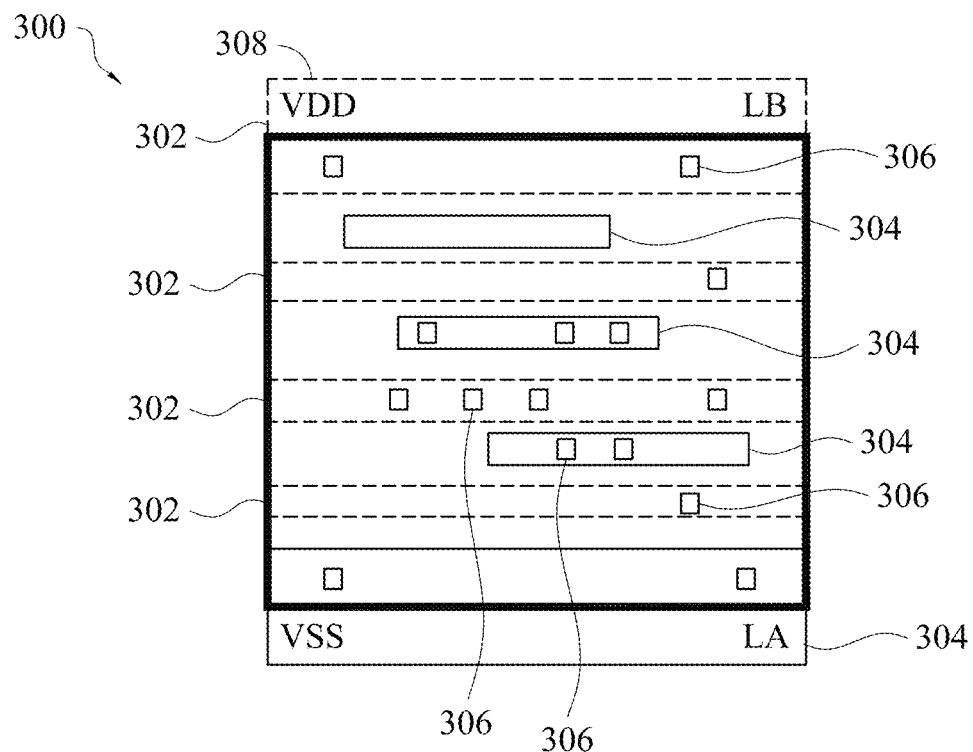
FIG. 3A is diagram of a double patterned cell in a layout design for integrated circuits, in accordance with some embodiments.

FIG. 3A is diagram of a double patterned cell 308 in a layout design for integrated circuits 300, in accordance with some embodiments. A first set of conductive traces 302 is oriented in a single direction. In some embodiments, the first set of conductive traces 302 includes an even-numbered quantity of conductive traces 302 oriented in a horizontal direction. In some embodiments, the conductive traces in the first set of conductive traces 302 are parallel metal lines in the same metal layer. The first set of conductive traces 302 is formed by photolithographic techniques using a first mask. The first mask, and correspondingly, the first set of conductive traces 302, has a predetermined pitch. In some embodiments, the pitch ranges from about 80 nanometers (nm) to about 100 nm.

A second set of conductive traces 304 is oriented in the same direction as the first set of conductive traces 302. In some embodiments, the second set of conductive traces 304 includes an even-numbered quantity of conductive traces 304 oriented in a horizontal direction. In some embodiments, the conductive traces in the second set of conductive traces 304 are parallel metal lines in the same metal layer. The second set of conductive traces 304 is formed by photolithographic techniques using a second mask. The second mask, and correspondingly, the second set of conductive traces 304, has a predetermined pitch. In some embodiments, the pitch of the first mask is equal to the pitch of the second mask. In some embodiments, the pitch of the first mask and the pitch of the second mask ranges from about 80 nm to about 100 nm. In some embodiments, the pitch of the second set of conductive traces 304 ranges from about 80 nm to about 100 nm.

The second mask is positioned such that the second mask is offset with respect to the first mask by less than the pitch for the first set of conductive traces 302. The pitch of the first set of conductive traces 302 to the second set of conductive traces 304 (i.e., the distance between the first set of conductive traces 302 and the second set of conductive traces 304) ranges from about 40 nm to about 80 nm. Together, each of the first set of conductive traces 302 and the second set of conductive traces 304 are formed by double patterning. Vias 306 electrically connect conductive traces in the first set of conductive traces 302 and the second set of conductive traces 304 to conductive traces in one or more other layers.

Cell 308 includes a conductive trace 302 that is a power rail LB and a conductive trace 304 that is a power rail LA. Cell 308 has an even-numbered total quantity of conductive traces 302 and 304 between the power rail LB and the power rail LA.

Figure 3B:
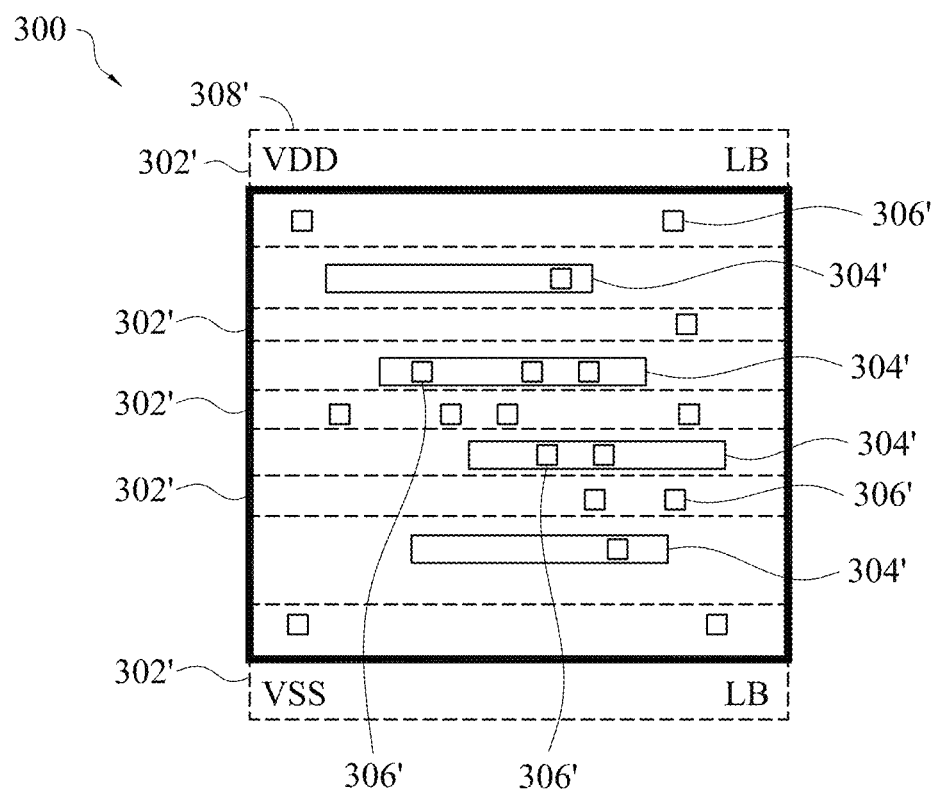
FIG. 3B is diagram of a double patterned cell in a layout design for integrated circuits, in accordance with some embodiments.

FIG. 3B is diagram of a double patterned cell 308' in a layout design for integrated circuits 300, in accordance with some embodiments. Double patterned cell 308' is similar to double patterned cell 308, but includes a different quantity of conductive traces. A first set of conductive traces 302' corresponds to the first set of conductive traces 302 (FIG. 3A), however, there is an odd-numbered quantity of conductive traces included in the first set of conductive traces 302' in FIG. 3B. A second set of conductive traces 304' corresponds to the second set of conductive traces 304 (FIG. 3A), the second set of conductive traces 304' includes an even-numbered quantity of line segments. Vias 306' correspond to vias 306 (FIG. 3A) and electrically connect conductive traces in the first set of conductive traces 302' and the second set of conductive traces 304' to conductive traces in one or more other layers within cell 308'.

Cell 308' includes a first conductive trace 302' that is a first power rail LB and a second conductive trace 302' that is a second power rail LB. Cell 308' has an odd-numbered total quantity of conductive traces 302' and 304' between the first power rail LB and the second power rail LB.

Figure 4:
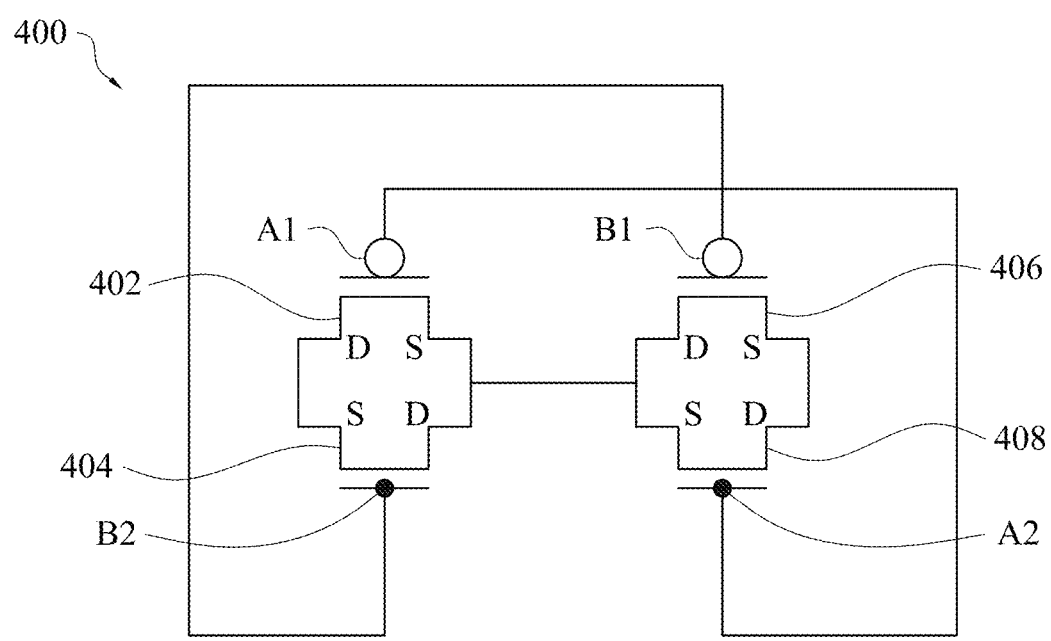
FIG. 4 is circuit diagram of a transmission gate corresponding to a layout design for integrated circuits, in accordance with some embodiments.

FIG. 4 is a circuit diagram of a transmission gate corresponding to a layout design for integrated circuits 400, in accordance with some embodiments. A first positive-type metal oxide semiconductor (PMOS) transistor 402 includes a gate terminal A1, a drain (D) terminal and a source (S) terminal. A first negative-type metal oxide semiconductor (NMOS) transistor 404 includes a gate terminal B2, a D terminal and an S terminal. The D terminal of the first PMOS transistor 402 is electrically connected to the S terminal of the first NMOS transistor 404 and the S terminal of the first PMOS transistor is electrically connected to the D terminal of the first NMOS transistor to form a first transistor pair.

A second PMOS transistor 406 includes a gate terminal B1, a D terminal and an S terminal. A second NMOS transistor 404 includes a gate terminal A2, a D terminal and an S terminal. The D terminal of the second PMOS transistor 406 is electrically connected to the S terminal of the second NMOS transistor 408 and the S terminal of the second PMOS transistor is electrically connected to the D terminal of the second NMOS transistor to form a second transistor pair.

Gate terminal A1 of first PMOS transistor 402 is electrically coupled to gate terminal A2 of second NMOS transistor 408. Gate terminal B1 of second PMOS transistor 406 is electrically coupled to gate terminal B2 of first NMOS transistor 404. The S terminal of the first PMOS transistor 402 and the D terminal of the first NMOS transistor 404 are electrically coupled to the D terminal of the second PMOS transistor 406 and the S terminal of the second NMOS transistor 408 to form a transmission gate 400. In some embodiments, the transmission gate 400 is in a single cell.

Figure 5:
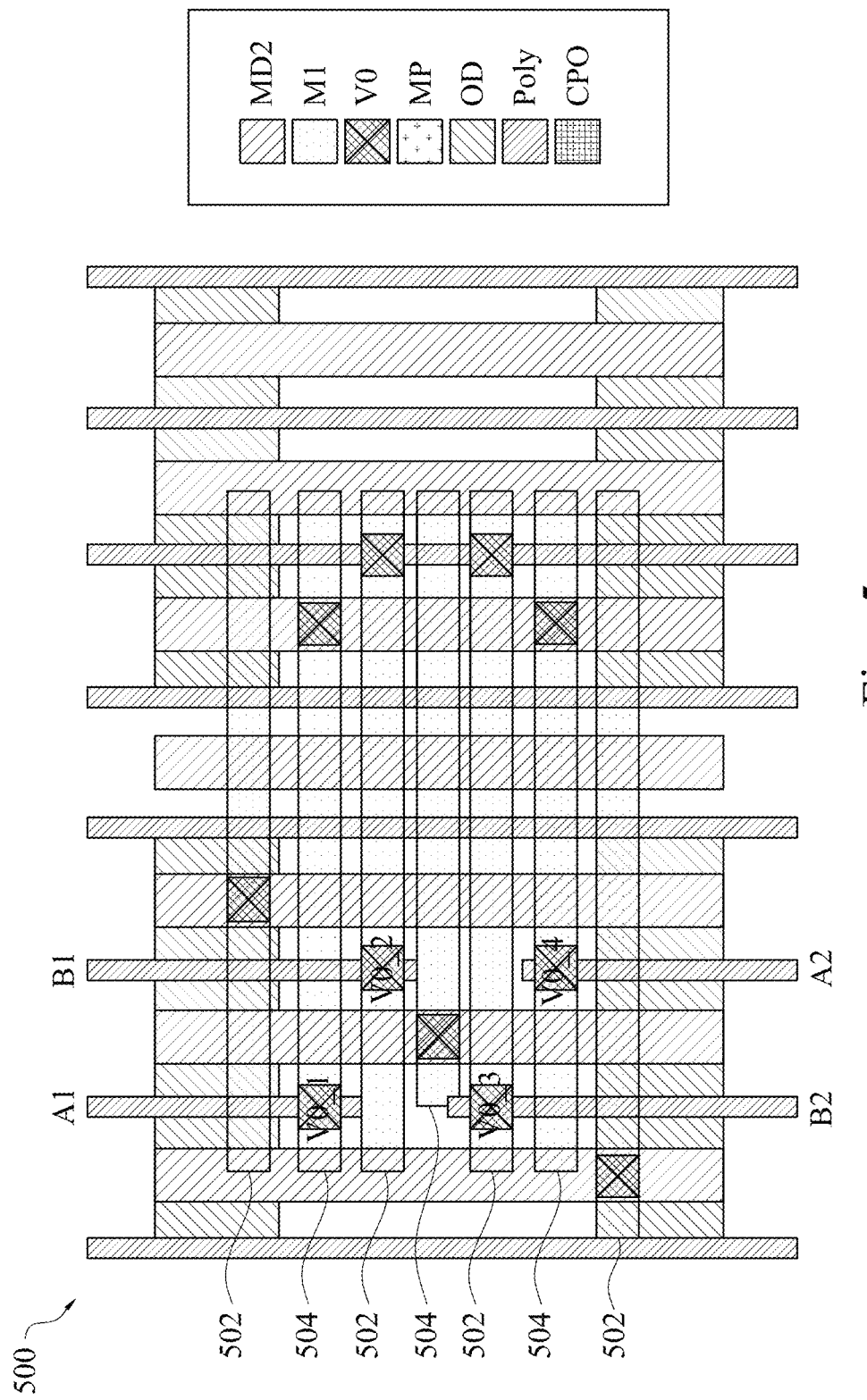
FIG. 5 is diagram of a layout design with a transmission gate cell for integrated circuits, in accordance with some embodiments.

FIG. 5 is diagram of a layout design with a transmission gate cell for integrated circuits 500, in accordance with some embodiments. The transmission gate cell 500 corresponds to the transmission gate of FIG. 4, e.g., a gate terminal A1 of a first PMOS transistor is electrically connected to a gate terminal A2 of a second NMOS transistor and a gate terminal B1 of a second PMOS transistor is electrically connected to a gate terminal B2 of a first NMOS transistor. As used herein, the phrase "electrically connected" includes the phrase "conductively connected." In some embodiments, the transmission gate cell 500 includes metal 1 (M1) portions, MD 2 (MD2) portions, via 0 (V0) portions, metal-polysilicon connected (MP) portions, oxide definition (OD) portions, polysilicon (Poly) portions and cut polysilicon (CPO) portions. In some embodiments, the M1 portions are contained in part of a metal layer in the transmission gate cell 500. In some embodiments, the M1 portions are part of the only metal layer in the transmission gate cell 500. In some embodiments, the M1 portions are positioned in one direction by double patterning with a first mask pattern and a second mask pattern.

In some embodiments, the Poly portions are also referred to as a set of conductive features extending along a first predetermined direction in a conductive layer, i.e., the polysilicon layer. In some embodiments, the MD2 portions are also referred to as a set of conductive features extending along the first predetermined direction in a conductive layer, i.e., the MD2 layer. In some embodiments, the M1 portions are also referred to as a set of conductive features extending along a second predetermined direction in a conductive layer, i.e., the M1 layer.

In some embodiments, the transmission gate cell 500 includes four conductive traces in a first set of conductive traces 502 and three conductive traces in a second set of conductive traces 504, equaling a total of seven conductive traces. In some embodiments, the first set of conductive traces 502 and the second set of conductive traces 504 are double patterned as M1 portions of a metal layer. In some embodiments, the first set of conductive traces 502 and the second set of conductive traces 504 are double patterned as seven metal lines in M1 portions of a metal layer.

Gate terminals A1, A2, B1 and B2 are formed of Poly portions. Gate terminal A1 in a first Poly portion is electrically connected through a first via V0_1 portion to a first M1 metal portion, the first M1 metal portion is electrically connected through a second via portion to an MD2 portion, the MD2 portion is electrically connected through a third via portion to a second M1 portion, the second M1 portion is electrically connected through a fourth via v0_4 to gate terminal A2 in a second Poly portion.

Gate terminal B1 in a third Poly portion is electrically connected through a fifth via V0_2 portion to a third M1 metal portion, the third M1 metal portion is electrically connected through a sixth via portion to a fourth Poly portion, the fourth Poly portion is electrically connected through a seventh via portion to a fourth M1 portion, the fourth M1 portion is electrically connected through a eighth via v0_3 to gate terminal B2 in a fourth Poly portion. In some embodiments, the transmission gate cell 500 includes at least six Poly portions. In some embodiments, the transmission gate cell 500 includes ten Poly portions.

In some embodiments, the conductive traces in the first conductive layer number five between a conductive trace electrically coupled to a power supply voltage and a conductive trace electrically coupled to a ground voltage, e.g., to form the transmission gate cell.

Figure 6:
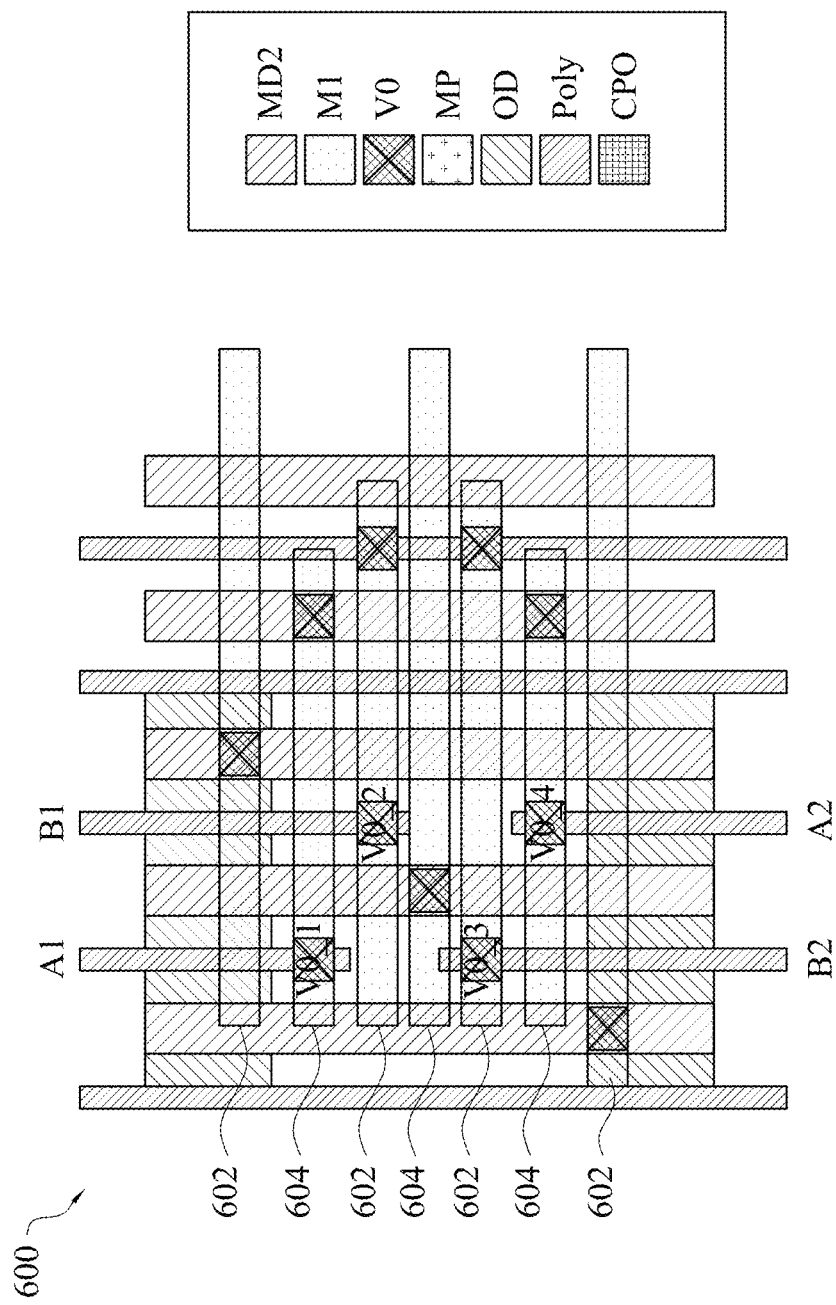
FIG. 6 is diagram of a layout design with a transmission gate cell for integrated circuits, in accordance with some embodiments.

FIG. 6 is diagram of a layout design with a transmission gate cell for integrated circuits 600, in accordance with some embodiments. Except as described herein and illustrated in FIG. 6, the description herein associated with FIG. 5 is applicable to FIG. 6. In some embodiments, the transmission gate cell 600 includes four conductive traces in a first set of conductive traces 602 and three conductive traces in a second set of conductive traces 604, equaling a total of seven conductive traces. In some embodiments, the first set of conductive traces 602 and the second set of conductive traces 604 are double patterned as M1 portions of a metal layer. In some embodiments, the first set of conductive traces 602 and the second set of conductive traces 604 are double patterned as seven metal lines in M1 portions of a metal layer.

Gate terminals A1, A2, B1 and B2 are formed of Poly portions. Gate terminal A1 in a first Poly portion is electrically connected through a first via V0_1 portion to a first M1 metal portion, the first M1 metal portion is electrically connected through a second via portion to an MD2 portion, the MD2 portion is electrically connected through a third via portion to a second M1 portion, the second M1 portion is electrically connected through a fourth via v0_4 to gate terminal A2 in a second Poly portion.

Gate terminal B1 in a third Poly portion is electrically connected through a fifth via V0_2 portion to a third M1 metal portion, the third M1 metal portion is electrically connected through a sixth via portion to a fourth Poly portion, the fourth Poly portion is electrically connected through a seventh via portion to a fourth M1 portion, the fourth M1 portion is electrically connected through a eighth via v0_3 to gate terminal B2 in a fourth Poly portion. In some embodiments, the transmission gate cell 600 includes at least six Poly portions. In some embodiments, the transmission gate cell 600 includes seven Poly portions.

Figure 7:
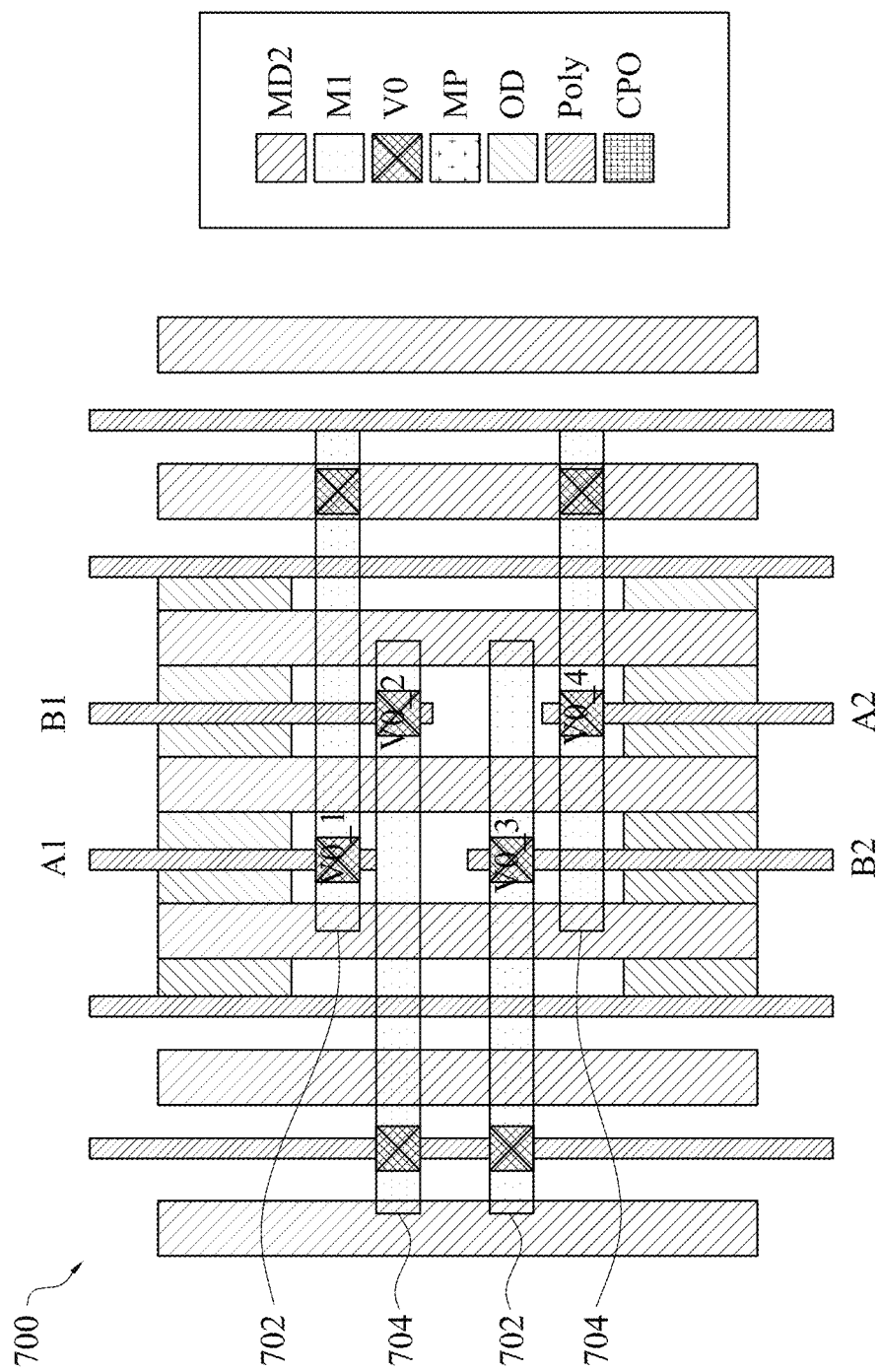
FIG. 7 is diagram of a layout design with a transmission gate cell for integrated circuits, in accordance with some embodiments.

FIG. 7 is diagram of a layout design with a transmission gate cell for integrated circuits 700, in accordance with some embodiments. Except as described herein and illustrated in FIG. 7, the description herein associated with FIG. 5 is applicable to FIG. 7. In some embodiments, the transmission gate cell 700 includes two conductive traces in a first set of conductive traces 702 and two conductive traces in a second set of conductive traces 704, equating to a total of four conductive traces. In some embodiments, the first set of conductive traces 702 and the second set of conductive traces 704 are double patterned as M1 portions of a metal layer. In some embodiments, the first set of conductive traces 702 and the second set of conductive traces 704 are double patterned as four metal lines in M1 portions of a metal layer.

Gate terminals A1, A2, B1 and B2 are formed of Poly portions. Gate terminal A1 in a first Poly portion is electrically connected through a first via V0_1 portion to a first M1 metal portion, the first M1 metal portion is electrically connected through a second via portion to an MD2 portion, the MD2 portion is electrically connected through a third via portion to a second M1 portion, the second M1 portion is electrically connected through a fourth via v0_4 to gate terminal A2 in a second Poly portion.

Gate terminal B1 in a third Poly portion is electrically connected through a fifth via V0_2 portion to a third M1 metal portion, the third M1 metal portion is electrically connected through a sixth via portion to a fourth Poly portion, the fourth Poly portion is electrically connected through a seventh via portion to a fourth M1 portion, the fourth M1 portion is electrically connected through a eighth via v0_3 to gate terminal B2 in a fourth Poly portion. In some embodiments, the transmission gate cell 700 includes at least six Poly portions. In some embodiments, the transmission gate cell 700 includes eight Poly portions.

Figure 8:
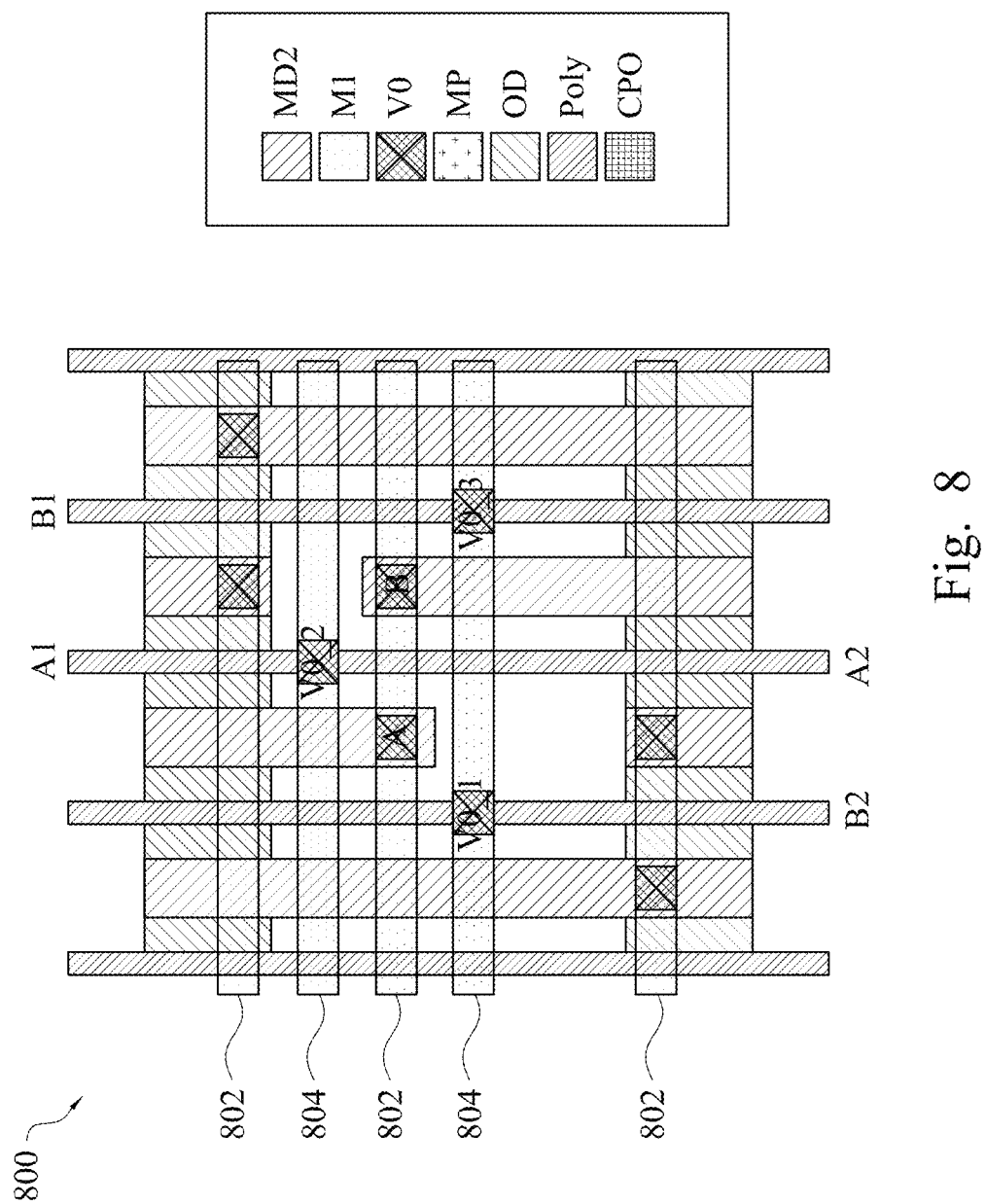
FIG. 8 is diagram of a layout design with a transmission gate cell for integrated circuits, in accordance with some embodiments.

FIG. 8 is diagram of a layout design with a transmission gate cell for integrated circuits 800, in accordance with some embodiments. Except as described herein and illustrated in FIG. 8, the description herein associated with FIG. 5 is applicable to FIG. 8. In some embodiments, the transmission gate cell 800 includes three conductive traces in a first set of conductive traces 802 and two conductive traces in a second set of conductive traces 804, equating to a total of five conductive traces. In some embodiments, the first set of conductive traces 802 and the second set of conductive traces 804 are double patterned as M1 portions of a metal layer. In some embodiments, the first set of conductive traces 802 and the second set of conductive traces 804 are double patterned as five metal lines in M1 portions of a metal layer.

Gate terminals A1, A2, B1 and B2 are formed of Poly portions. Gate terminal A1 shares a first Poly portion with gate terminal A2. The first Poly portion is electrically connected through a first via V0_2 to a first M1 metal portion.

Gate terminal B1 in a second Poly portion is electrically connected through a second via V0_3 portion to a second M1 metal portion, the second M1 metal portion is electrically connected through a third via v0_1 portion to gate terminal B2 in a third Poly portion. In some embodiments, the transmission gate cell 800 includes at least three unbroken Poly portions. Unbroken Poly portions are not separated vertically from one or more other Poly portions. In some embodiments, the transmission gate cell 800 includes five Poly portions.

Figure 9:
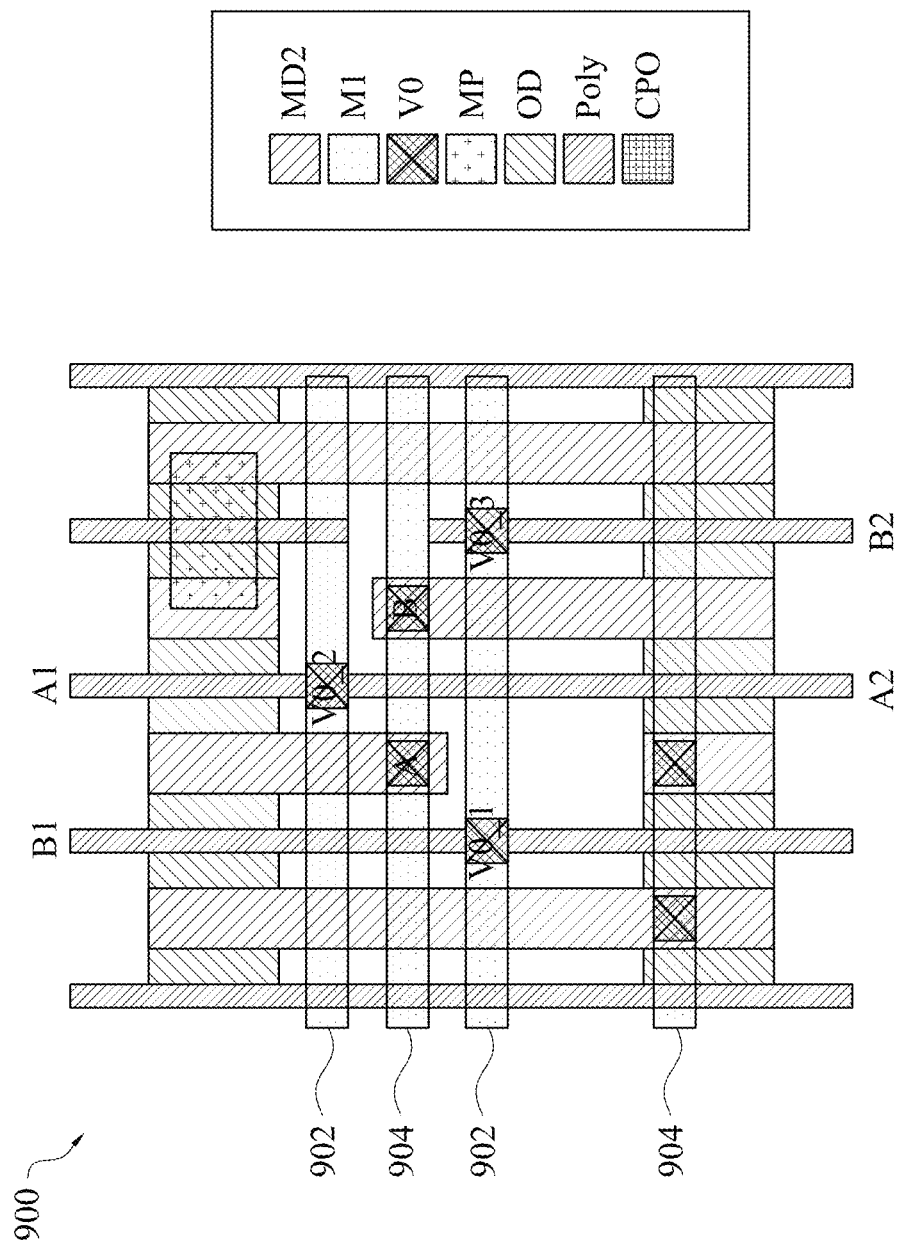
FIG. 9 is diagram of a layout design with a transmission gate cell for integrated circuits, in accordance with some embodiments.

FIG. 9 is diagram of a layout design with a transmission gate cell for integrated circuits 900, in accordance with some embodiments. Except as described herein and illustrated in FIG. 9, the description herein associated with FIG. 5 is applicable to FIG. 9. In some embodiments, the transmission gate cell 900 includes two conductive traces in a first set of conductive traces 902 and two conductive traces in a second set of conductive traces 904, equating to a total of four conductive traces. In some embodiments, the first set of conductive traces 902 and the second set of conductive traces 904 are double patterned as M1 portions of a metal layer. In some embodiments, the first set of conductive traces 902 and the second set of conductive traces 904 are double patterned as four metal lines in M1 portions of a metal layer.

Gate terminals A1, A2, B1 and B2 are formed of Poly portions. Gate terminal A1 shares a first Poly portion with gate terminal A2. The first Poly portion is electrically connected through a first via V0_2 to a first M1 metal portion.

Gate terminal B1 in a second Poly portion is electrically connected through a second via V0_1 portion to a second M1 metal portion, the second M1 metal portion is electrically connected through a third via v0_3 portion to gate terminal B2 in a third Poly portion. In some embodiments, a bottom portion of the first Poly portion forms a first dummy transistor. In some embodiments, a MP portion forms a second dummy transistor. In some embodiments, the transmission gate cell 900 includes at least three unbroken Poly portions. In some embodiments, the transmission gate cell 900 includes six Poly portions.

Figure 10:
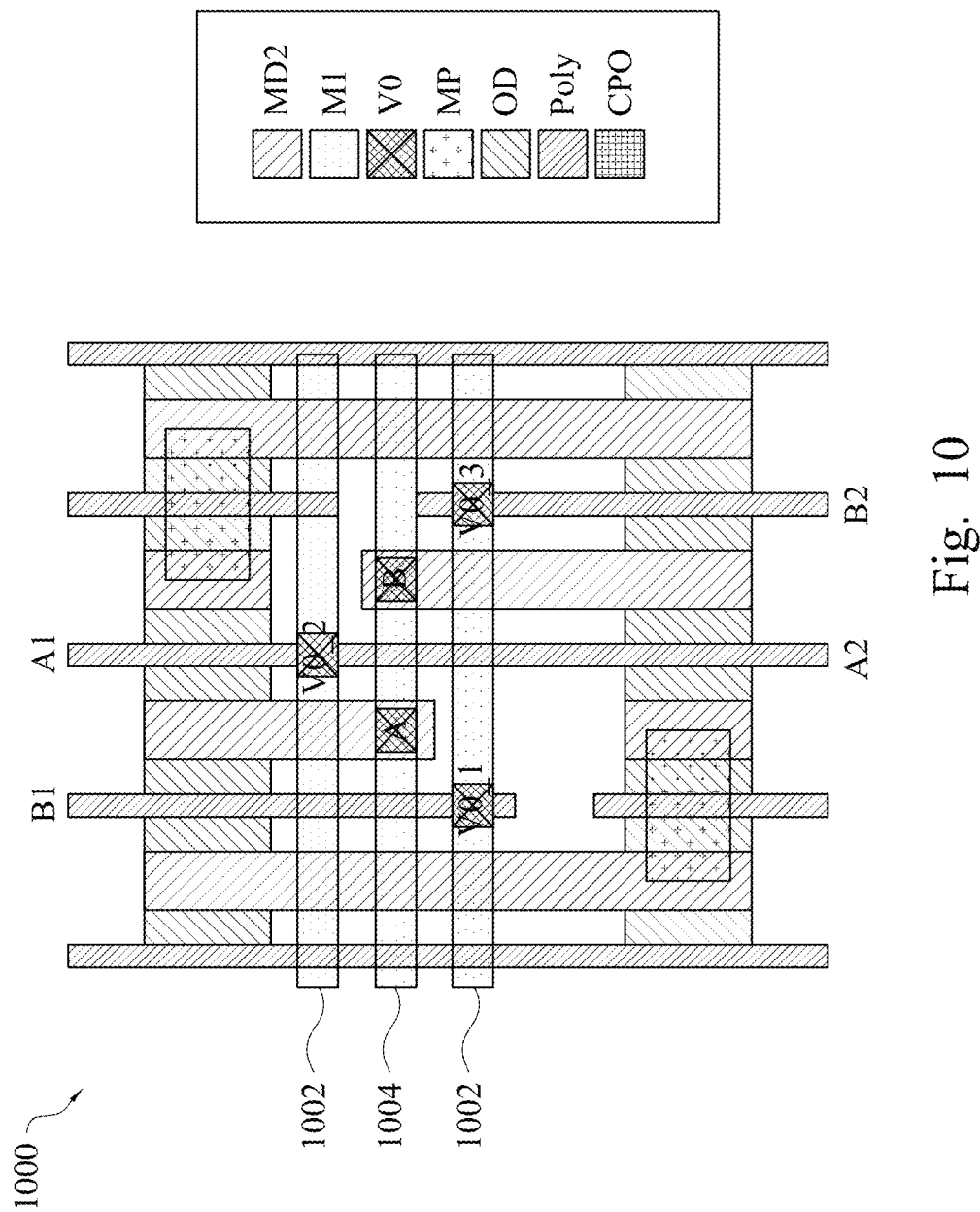
FIG. 10 is diagram of a layout design with a transmission gate cell for integrated circuits, in accordance with some embodiments.

FIG. 10 is diagram of a layout design with a transmission gate cell for integrated circuits 1000, in accordance with some embodiments. Except as described herein and illustrated in FIG. 10, the description herein associated with FIG. 5 is applicable to FIG. 10. In some embodiments, the transmission gate cell 1000 includes two conductive traces in a first set of conductive traces 1002 and one conductive trace in a second set of conductive traces 1004, equating to a total of three conductive traces. In some embodiments, the first set of conductive traces 1002 and the second set of conductive traces 1004 are double patterned as M1 portions of a metal layer. In some embodiments, the first set of conductive traces 1002 and the second set of conductive traces 1004 are double patterned as three metal lines in M1 portions of a metal layer.

Gate terminals A1, A2, B1 and B2 are formed of Poly portions. Gate terminal A1 shares a first Poly portion with gate terminal A2. The first Poly portion is electrically connected through a first via V0_2 to a first M1 metal portion.

Gate terminal B1 in a second Poly portion is electrically connected through a second via V0_1 portion to a second M1 metal portion, the second M1 metal portion is electrically connected through a third via v0_3 portion to gate terminal B2 in a third Poly portion. In some embodiments, a bottom portion of the first Poly portion forms a first dummy transistor. In some embodiments, a MP portion forms a second dummy transistor. In some embodiments, the transmission gate cell 1000 includes at least three unbroken Poly portions. In some embodiments, the transmission gate cell 1000 includes seven Poly portions.

Figure 11:
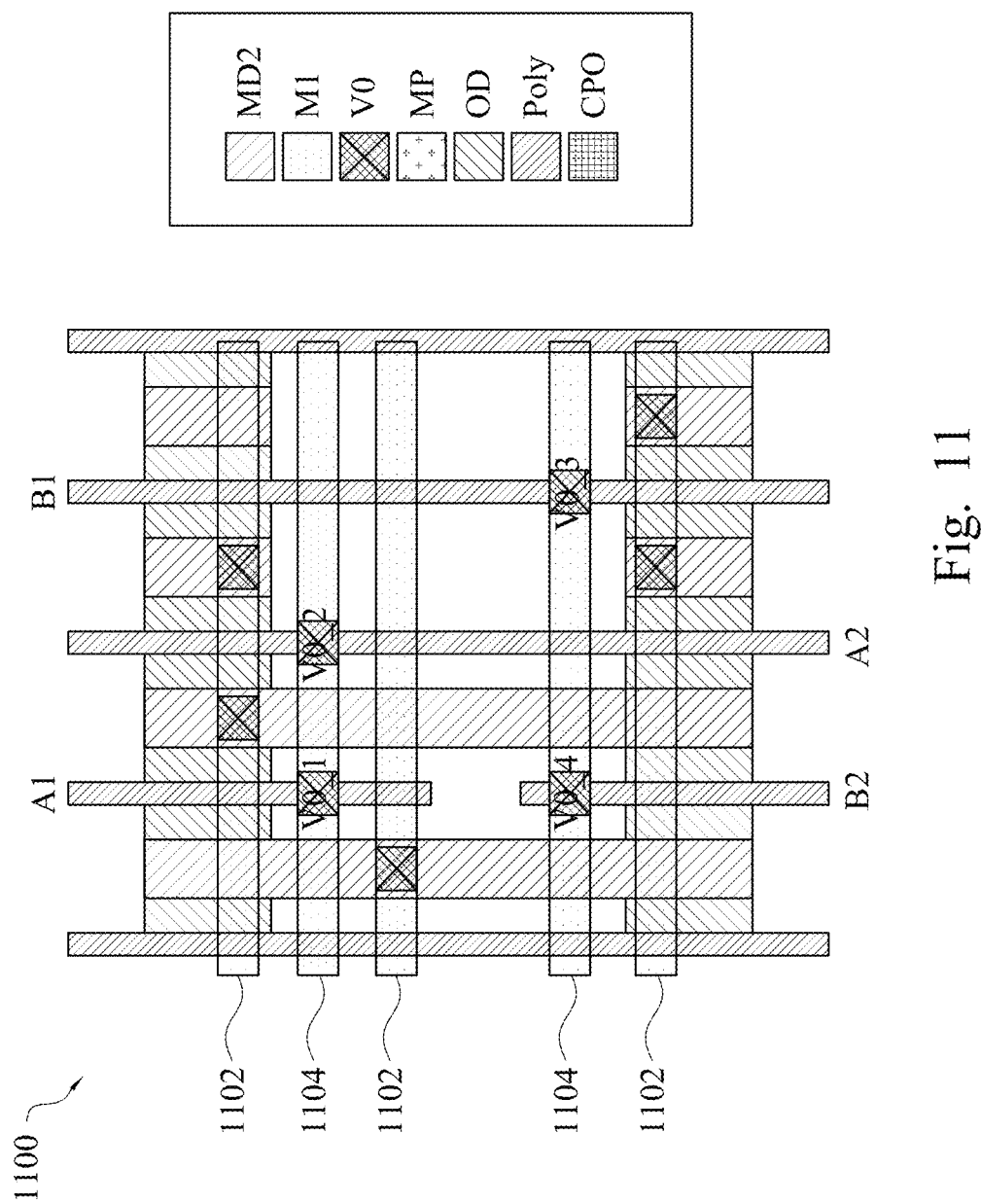
FIG. 11 is diagram of a layout design with a transmission gate cell for integrated circuits, in accordance with some embodiments.

FIG. 11 is diagram of a layout design with a transmission gate cell for integrated circuits 1100, in accordance with some embodiments. Except as described herein and illustrated in FIG. 11, the description herein associated with FIG. 5 is applicable to FIG. 11. In some embodiments, the transmission gate cell 1100 includes three conductive traces in a first set of conductive traces 1102 and two conductive traces in a second set of conductive traces 1104, equating to a total of five conductive traces. In some embodiments, the first set of conductive traces 1102 and the second set of conductive traces 1104 are double patterned as M1 portions of a metal layer. In some embodiments, the first set of conductive traces 1102 and the second set of conductive traces 1104 are double patterned as five metal lines in M1 portions of a metal layer.

Gate terminals A1, A2, B1 and B2 are formed of Poly portions. Gate terminal A1 in a first Poly portion is electrically connected through a first via V0_1 portion to a first M1 metal portion, the first M1 metal portion is electrically connected through a second via V0_2 portion to gate terminal A2 in a second Poly portion.

Gate terminal B1 in a second Poly portion is electrically connected through a third via V0_3 portion to a second M1 metal portion, the second M1 metal portion is electrically connected through a third via v0_4 portion to gate terminal B2 in a fourth Poly portion. In some embodiments, a bottom portion of the third Poly portion forms a dummy transistor. In some embodiments, the transmission gate cell 1100 includes at least six Poly portions. In some embodiments, the transmission gate cell 1100 includes six Poly portions.

Figure 12:
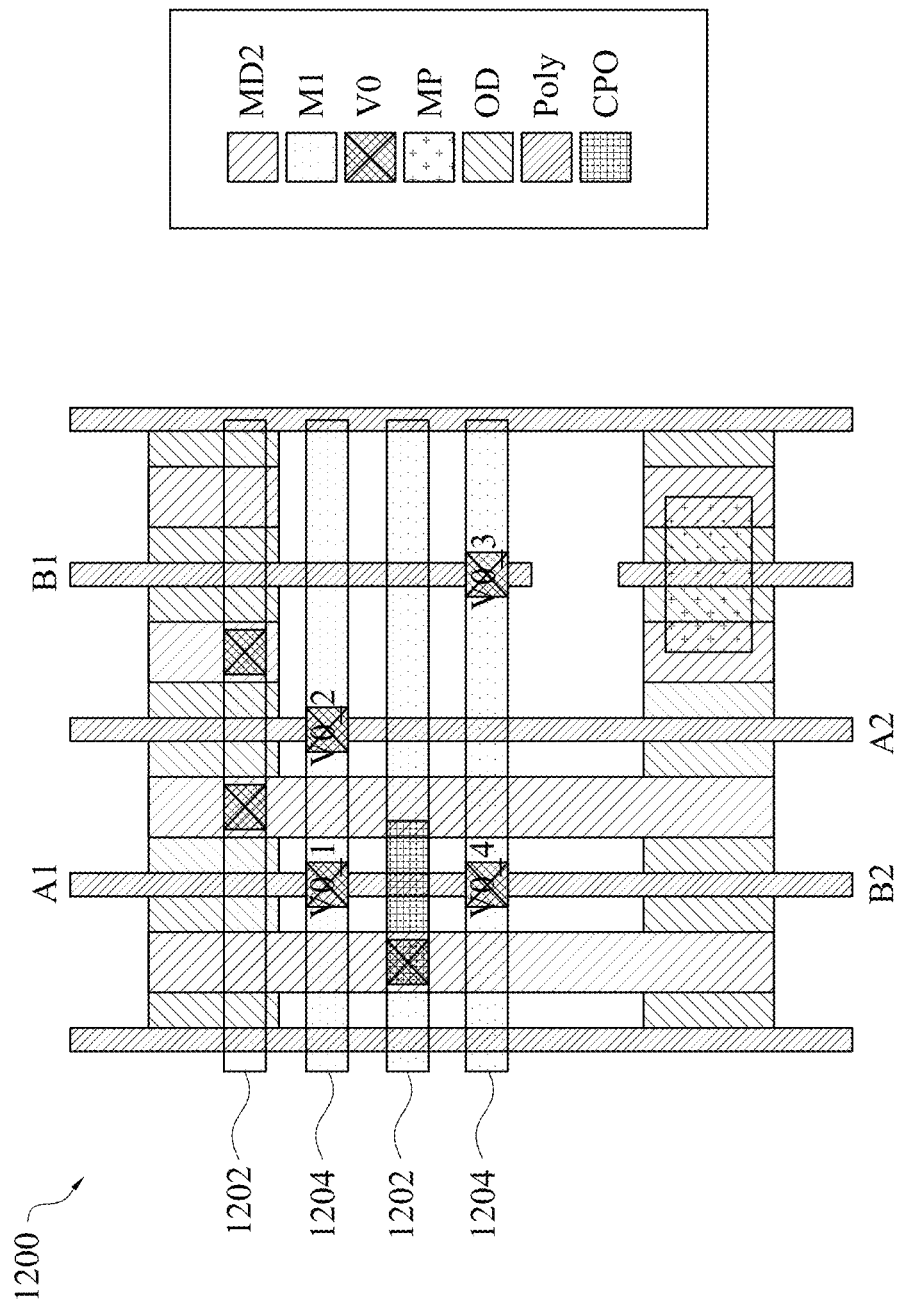
FIG. 12 is diagram of a layout design with a transmission gate cell for integrated circuits, in accordance with some embodiments.

FIG. 12 is diagram of a layout design with a transmission gate cell for integrated circuits 1200, in accordance with some embodiments. Except as described herein and illustrated in FIG. 12, the description herein associated with FIG. 5 is applicable to FIG. 12. In some embodiments, the transmission gate cell 1200 includes two conductive traces in a first set of conductive traces 1202 and two conductive traces in a second set of conductive traces 1204, equating to a total of four conductive traces. In some embodiments, the first set of conductive traces 1202 and the second set of conductive traces 1204 are double patterned as M1 portions of a metal layer. In some embodiments, the first set of conductive traces 1202 and the second set of conductive traces 1204 are double patterned as four metal lines in M1 portions of a metal layer.

Gate terminals A1, A2, B1 and B2 are formed of Poly portions. Gate terminal A1 in a first Poly portion is electrically connected through a first via V0_1 portion to a first M1 metal portion, the first M1 metal portion is electrically connected through a second via V0_2 portion to gate terminal A2 in a second Poly portion.

Gate terminal B1 in a third Poly portion is electrically connected through a third via V0_3 portion to a second M1 metal portion, the second M1 metal portion is electrically connected through a fourth via v0_4 portion to gate terminal B2 in the first Poly portion. In some embodiments, a bottom portion of the third Poly portion forms a dummy transistor. In some embodiments, the transmission gate cell 1200 includes at least six Poly portions. In some embodiments, the transmission gate cell 1200 includes six Poly portions.

Figure 13:
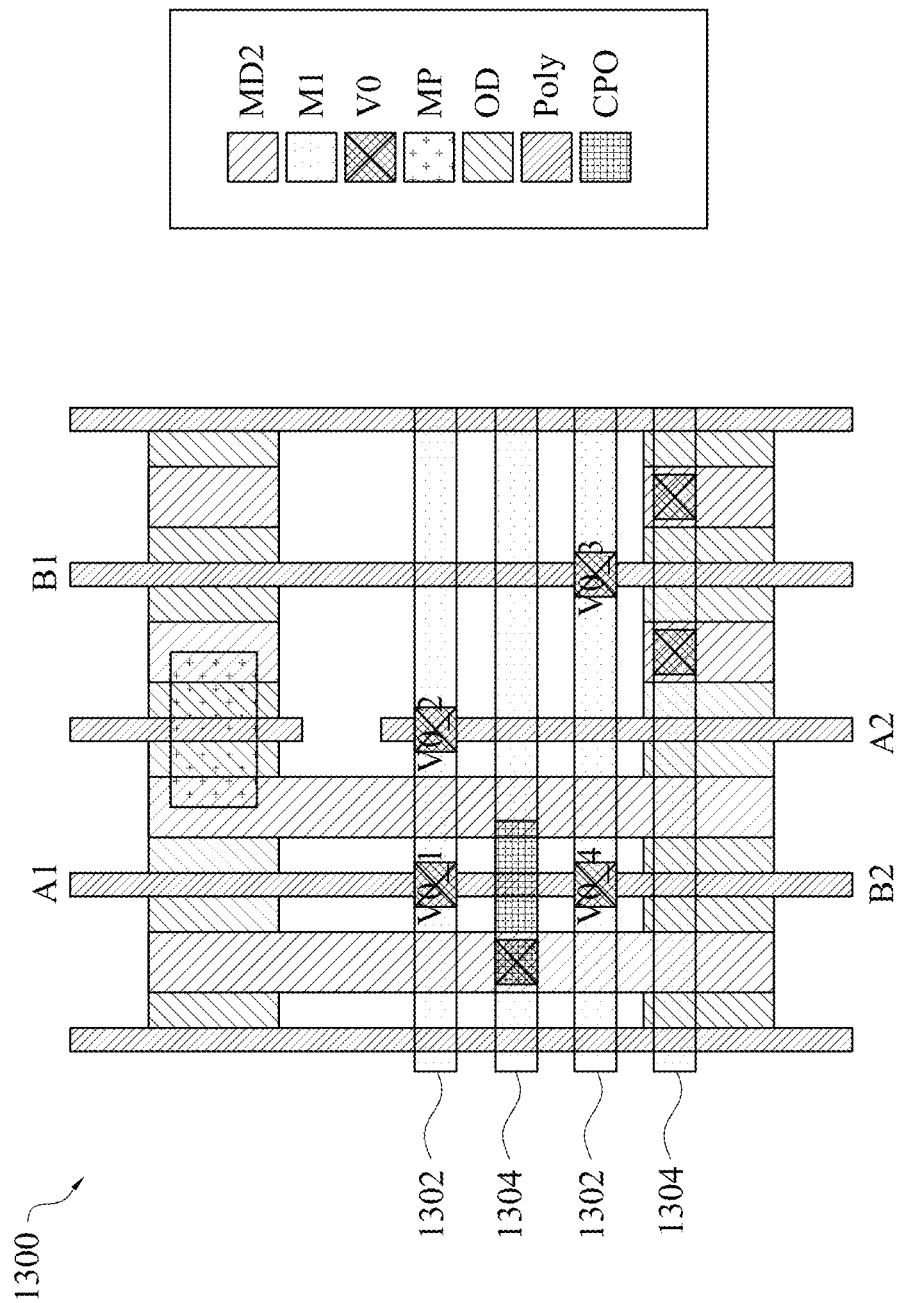
FIG. 13 is diagram of a layout design with a transmission gate cell for integrated circuits, in accordance with some embodiments.

FIG. 13 is diagram of a layout design with a transmission gate cell for integrated circuits 1300, in accordance with some embodiments. Except as described herein and illustrated in FIG. 13, the description herein associated with FIG. 5 is applicable to FIG. 13. In some embodiments, the transmission gate cell 1300 includes two conductive traces in a first set of conductive traces 1302 and two conductive traces in a second set of conductive traces 1304, equating to a total of four conductive traces. In some embodiments, the first set of conductive traces 1302 and the second set of conductive traces 1304 are double patterned as M1 portions of a metal layer. In some embodiments, the first set of conductive traces 1302 and the second set of conductive traces 1304 are double patterned as four metal lines in M1 portions of a metal layer.

Gate terminals A1, A2, B1 and B2 are formed of Poly portions. Gate terminal A1 in a first Poly portion is electrically connected through a first via V0 _1 portion to a first M1 metal portion, the first M1 metal portion is electrically connected through a second via V0_2 portion to gate terminal A2 in a second Poly portion.

Gate terminal B1 in a third Poly portion is electrically connected through a third via V0_3 portion to a second M1 metal portion, the second M1 metal portion is electrically connected through a fourth via v0_4 portion to gate terminal B2 in the first Poly portion. In some embodiments, a top portion of the second Poly portion forms a dummy transistor. In some embodiments, a bottom portion of the third Poly portion forms a dummy transistor. In some embodiments, the transmission gate cell 1300 includes at least six Poly portions. In some embodiments, the transmission gate cell 1300 includes six Poly portions.

Figure 14:
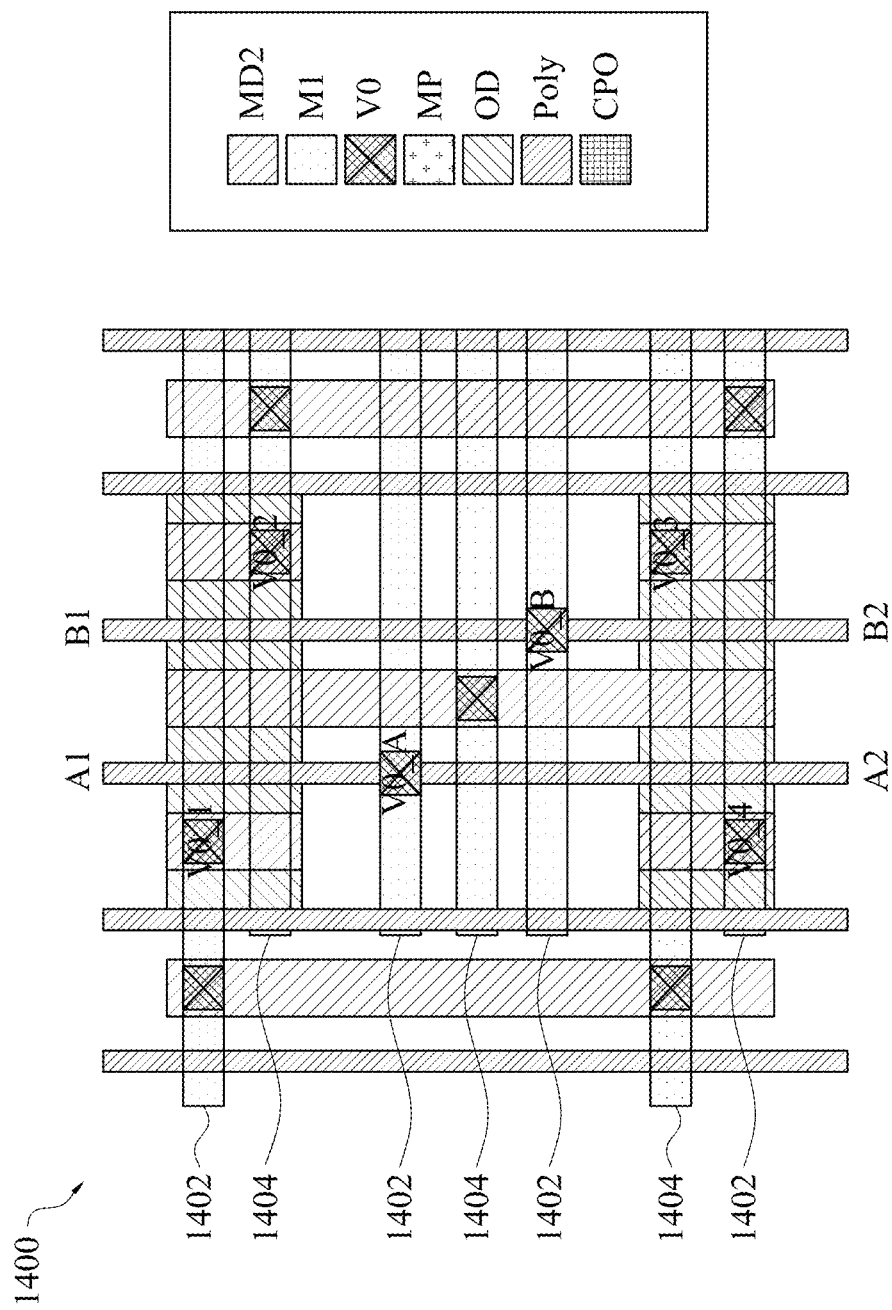
FIG. 14 is diagram of a layout design with a transmission gate cell for integrated circuits, in accordance with some embodiments.

FIG. 14 is diagram of a layout design with a transmission gate cell for integrated circuits 1400, in accordance with some embodiments. Except as described herein and illustrated in FIG. 14, the description herein associated with FIG. 5 is applicable to FIG. 14. In some embodiments, the transmission gate cell 1400 includes four conductive traces in a first set of conductive traces 1402 and three conductive traces in a second set of conductive traces 1404, equating to a total of seven conductive traces. In some embodiments, the first set of conductive traces 1402 and the second set of conductive traces 1404 are double patterned as M1 portions of a metal layer. In some embodiments, the first set of conductive traces 1402 and the second set of conductive traces 1404 are double patterned as seven metal lines in M1 portions of a metal layer.

Gate terminals A1, A2, B1 and B2 are formed of Poly portions. Gate terminal A1 shares a first Poly portion with gate terminal A2. The first Poly portion is electrically connected through a first via V0 _A to a first M1 metal portion.

Gate terminal B1 shares a second Poly portion with gate terminal B2. The second Poly portion is electrically connected through a second via V0 _B to a second M1 metal portion. In some embodiments, the transmission gate cell 1400 includes at least four Poly portions. In some embodiments, the transmission gate cell 1400 includes six Poly portions.

Figure 15:
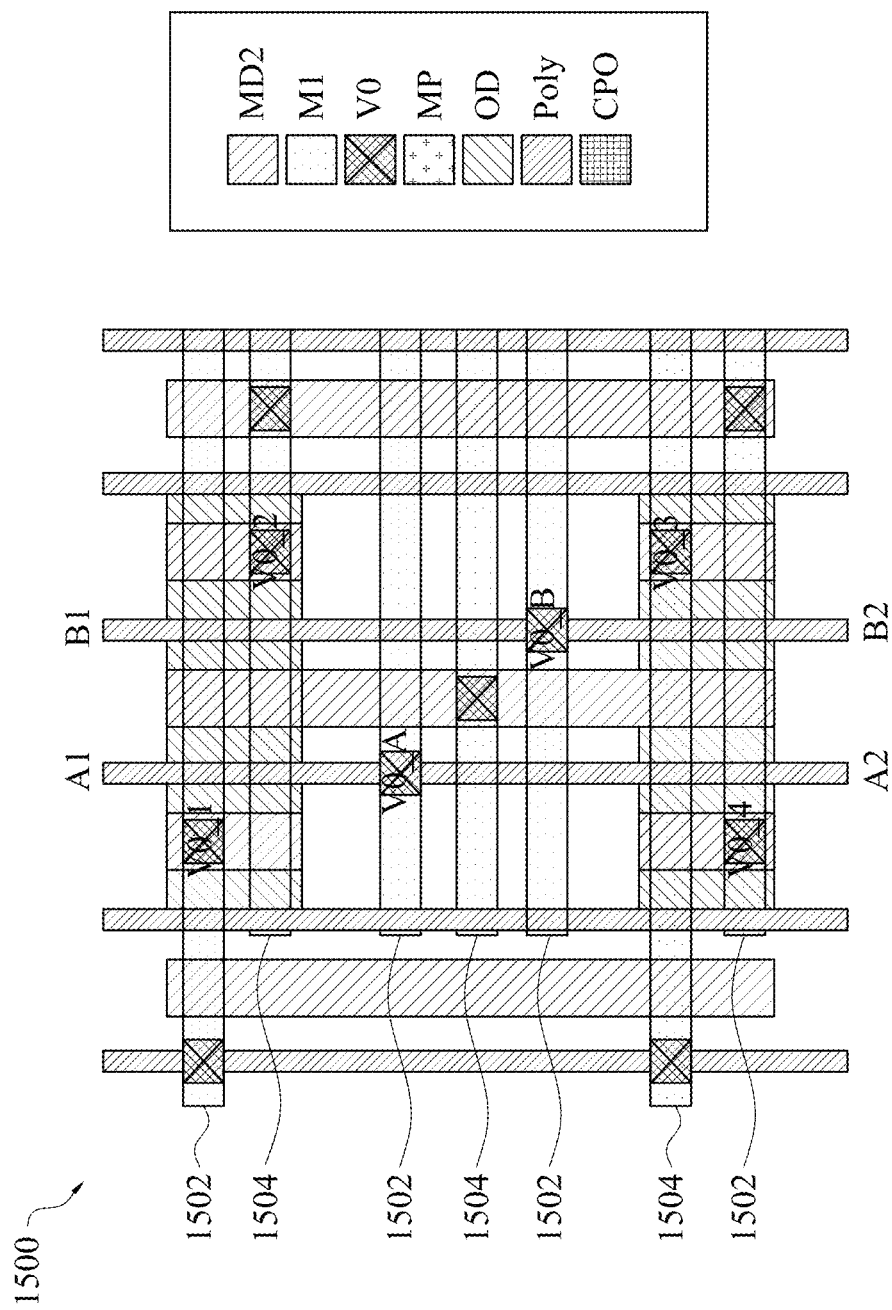
FIG. 15 is diagram of a layout design with a transmission gate cell for integrated circuits, in accordance with some embodiments.

FIG. 15 is diagram of a layout design with a transmission gate cell for integrated circuits 1500, in accordance with some embodiments. Except as described herein and illustrated in FIG. 15, the description herein associated with FIG. 5 is applicable to FIG. 15. In some embodiments, the transmission gate cell 1500 includes four conductive traces in a first set of conductive traces 1502 and three conductive traces in a second set of conductive traces 1504, equating to a total of seven conductive traces. In some embodiments, the first set of conductive traces 1502 and the second set of conductive traces 1504 are double patterned as M1 portions of a metal layer. In some embodiments, the first set of conductive traces 1502 and the second set of conductive traces 1504 are double patterned as seven metal lines in M1 portions of a metal layer.

Gate terminals A1, A2, B1 and B2 are formed of Poly portions. Gate terminal A1 shares a first Poly portion with gate terminal A2. The first Poly portion is electrically connected through a first via V0 _A to a first M1 metal portion.

Gate terminal B1 shares a second Poly portion with gate terminal B2. The second Poly portion is electrically connected through a second via V0 _B to a second M1 metal portion. In some embodiments, the transmission gate cell 1500 includes at least four Poly portions. In some embodiments, the transmission gate cell 1500 includes six Poly portions.

Figure 16:
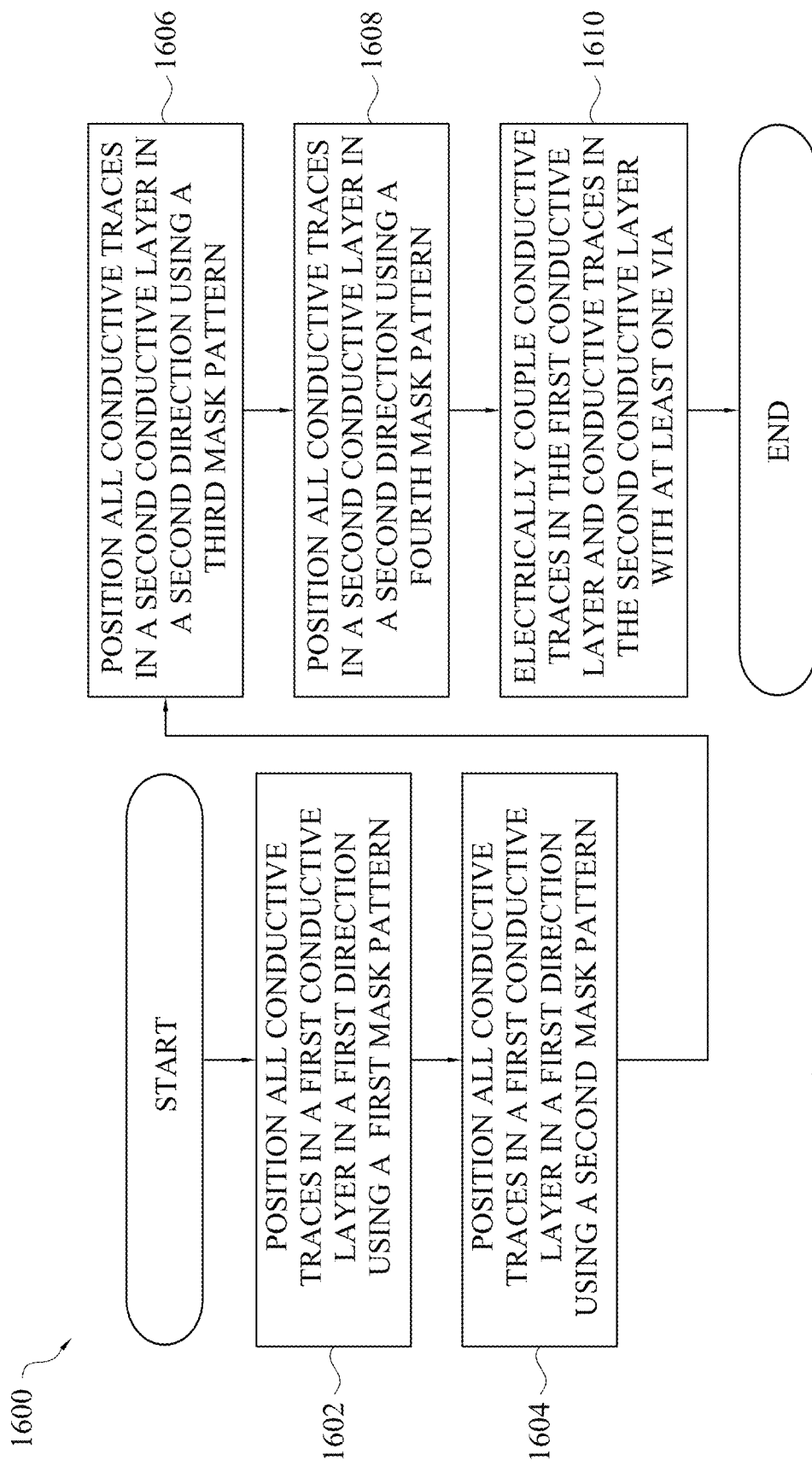
FIG. 16 is a flow chart of a method of layout design for integrated circuits, in accordance with some embodiments.

FIG. 16 is a flow chart of a method of layout design for integrated circuits 1600, in accordance with some embodiments. The method 1600 is performed by a programmed processor executing a set of instructions. In operation 1602, all conductive traces in a first conductive layer that are formed using a first mask pattern are positioned in a first direction. In some embodiments the conductive traces formed using the first mask pattern are parallel metal lines. In operation 1604, all conductive traces in the first conductive layer that are formed using a second mask pattern are positioned in the first direction. In some embodiments, the conductive traces formed using the second mask pattern are parallel metal lines. In some embodiments, the second mask pattern is offset from the first mask pattern by less than a pitch of the first mask pattern.

In operation 1606, all conductive traces in a second conductive layer that are formed using a third mask pattern are positioned in a second direction. In some embodiments the conductive traces formed using the third mask pattern are parallel polysilicon lines. In operation 1608, all conductive traces in the second conductive layer that are formed using a fourth mask pattern are positioned in the second direction. In some embodiments, the conductive traces formed using the fourth mask pattern are parallel polysilicon lines. In some embodiments, the third mask pattern is offset from the fourth mask pattern by less than a pitch of the third mask pattern. In some embodiments the first direction at a right angle to the second direction. In some embodiments the first direction is horizontal and the second direction is vertical. In some embodiments the first direction is vertical and the second direction is horizontal. In operation 1610, at least one via is formed to electrically connect the first conductive layer and the second conductive layer.

Figure 17:
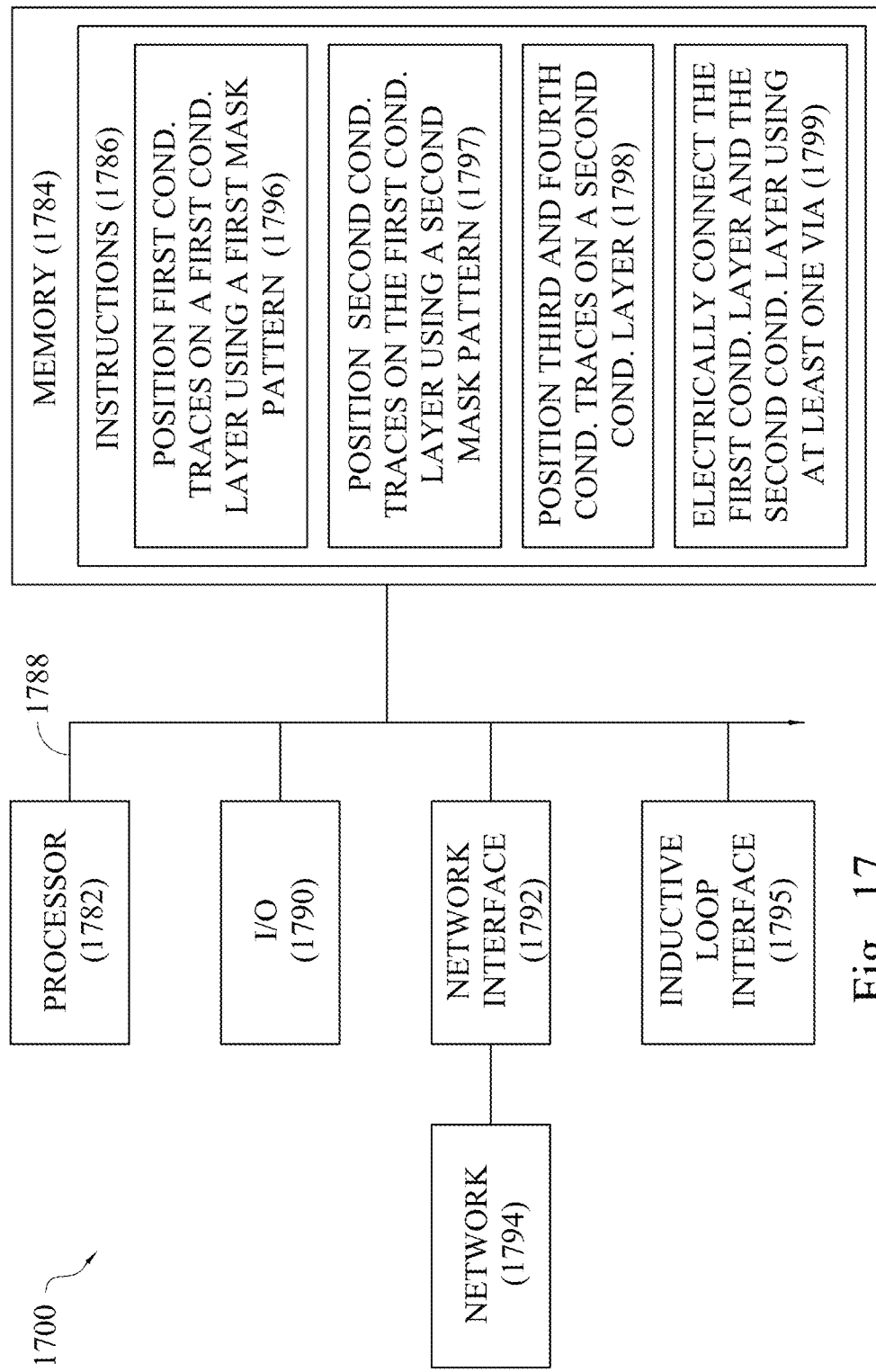
FIG. 17 is a block diagram of a computer system portion of a layout design for integrated circuits system, in accordance with some embodiments.

FIG. 17 is a block diagram of a computer system 1700 portion of a layout design for integrated circuits system, in accordance with some embodiments In some embodiments, the computer system 1700 executes a set of instructions to perform the method of layout design for integrated circuits 1600 (FIG. 16). Computer system 1700 includes a hardware processor 1782 and a non-transitory, computer readable storage medium 1784 encoded with, i.e., storing, the computer program code 1786, i.e., a set of executable instructions. The processor 1782 is electrically coupled to the computer readable storage medium 1784 via a bus 1788. The processor 1782 is also electrically coupled to an I/O interface 1790 by bus 1788. A network interface 1792 is also electrically connected to the processor 1782 via bus 1788. Network interface 1792 is connected to a network 1794, so that processor 1782 and computer readable storage medium 1784 are capable of connecting and communicating to external elements via network 1794. The processor 1782 is configured to execute the computer program code 1786 encoded in the computer readable storage medium 1784 in order to cause computer system 1700 to be usable for performing a portion or all of the operations as described with respect to the method of layout design for integrated circuits 1600 (FIG. 16).

In some embodiments, the computer program code 1786 includes an instruction 1796 to position all conductive traces on a first conductive layer using a first mask pattern in a first direction. An instruction 1797 positions all conductive traces on the first conductive layer using a second mask pattern in the first direction. An instruction 1798 positions all conductive traces on a second conductive layer in a second direction using a third mask pattern and a fourth mask pattern. An instruction 1799 electrically connects conductive traces in the first conductive layer and the second conductive layer using at least one via. In some embodiments, the first direction is at a right angle to the second direction.

In some embodiments, the processor 1782 is a central processing unit (CPU), a multi-processor, a distributed processing system, an application specific integrated circuit (ASIC), and/or a suitable processing unit.

In some embodiments, the computer readable storage medium 1784 is an electronic, magnetic, optical, electromagnetic, infrared, and/or a semiconductor system (or apparatus or device). For example, the computer readable storage medium 1784 includes a semiconductor or solid-state memory, a magnetic tape, a removable computer diskette, a random access memory (RAM), a read-only memory (ROM), a rigid magnetic disk, and/or an optical disk. In some embodiments, using optical disks, the computer readable storage medium 1784 includes a compact disk-read only memory (CD-ROM), a compact disk-read/write (CD-R/W), a digital video disc (DVD) and/or Blu-Ray Disk.

In some embodiments, the storage medium 1784 stores the computer program code 1786 configured to cause computer system 1700 to perform the operations as described with respect to the method of layout design for integrated circuits 1600 (FIG. 16).

In some embodiments, the storage medium 1784 stores instructions 1786 for interfacing with external components. The instructions 1786 enable processor 1782 to generate operating instructions readable by a system for performing the method of layout design for integrated circuits 1600 (FIG. 16).

Computer system 1700 includes I/O interface 1790. I/O interface 1790 is coupled to external circuitry. In some embodiments, I/O interface 1790 includes a keyboard, keypad, mouse, trackball, trackpad, and/or cursor direction keys for communicating information and commands to processor 1782.

Computer system 1700 also includes network interface 1792 coupled to the processor 1782. Network interface 1792 allows computer system 1700 to communicate with network 1794, to which one or more other computer systems are connected. Network interface 1792 includes wireless network interfaces such as BLUETOOTH, WIFI, WIMAX, GPRS, or WCDMA; or wired network interface such as ETHERNET, USB, or IEEE-1394.

Computer system 1700 also includes inductive loop interface 1795 coupled to the processor 1782. Inductive loop interface 1795 allows computer system 1700 to communicate with external devices, to which one or more other computer systems are connected. In some embodiments, the operations as described above are implemented in two or more computer systems 1790.

Computer system 1700 is configured to receive information related to the instructions 1786 through I/O interface 1790. The information is transferred to processor 1782 via bus 1788 to determine corresponding adjustments to the transportation operation. The instructions are then stored in computer readable medium 1784 as instructions 1786.

Some embodiments include a method of manufacturing an integrated circuit. The method includes manufacturing a first set of conductive features by a first mask, positioning a set of gates in a second direction different from the first direction, manufacturing a second set of conductive features by a second mask and electrically coupling, by at least a first conductive feature of the first set of conductive features, a first portion of the set of gates to a second portion of the set of gates. The first set of conductive features is in a first direction and a first layer of the integrated circuit. The set of gates is in a second layer of the integrated circuit. The second layer is different from the first layer. The second set of conductive features is in the first direction and the first layer of the integrated circuit. The first portion of the set of gates corresponds to a gate terminal of a first n-type transistor. The second portion of the set of gates corresponds to a gate terminal of a first p-type transistor. The first n-type transistor is part of a first transmission gate. The first p-type transistor is part of a second transmission gate.

Some embodiments include an integrated circuit. The integrated circuit includes a first set of conductive traces in a first layer of the integrated circuit, a second set of conductive traces in a second layer of the integrated circuit different from the first layer, a gate terminal of a first p-type transistor, a gate terminal of a first n-type transistor and a first via. The first set of conductive traces extend in a first direction. The second set of conductive traces extend in a second direction different from the first direction. The gate terminal of the first p-type transistor includes a first conductive trace of the second set of conductive traces. The gate terminal of the first n-type transistor includes a second conductive trace of the second set of conductive traces. The first via is electrically coupled between a first conductive trace of the first set of conductive traces and the first conductive trace of the second set of conductive traces. The first conductive trace of the second set of conductive traces and the second conductive trace of the second set of conductive traces are aligned along a common axis. The first n-type transistor and the first p-type transistor are part of a first transmission gate.

Some embodiments include an integrated circuit. The integrated circuit includes a first PMOS transistor, a first NMOS transistor, a first dummy transistor, a second dummy transistor, a set of gates and a first set of conductive features. The first PMOS transistor includes a gate. The first PMOS transistor is part of a first transmission gate. The first NMOS transistor includes a gate. The first NMOS transistor is part of a second transmission gate. The set of gates extend in a first direction in a first layer of the integrated circuit. A first gate portion of the set of gates extends across an active region of the first PMOS transistor and an active region of the first NMOS transistor. The first gate portion of the set of gates is the gate of the first PMOS transistor and the gate of the first NMOS transistor. The first set of conductive features extends in a second direction different from the first direction, and is in a second layer of the integrated circuit different from the first layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit comprising:
manufacturing a first set of conductive features by a first mask, the first set of conductive features being in a first direction and a first layer of the integrated circuit;
positioning a set of gates in a second direction different from the first direction, the set of gates being in a second layer of the integrated circuit, the second layer being different from the first layer;
manufacturing a second set of conductive features by a second mask, the second set of conductive features being in the first direction and the first layer of the integrated circuit; and
electrically coupling, by at least a first conductive feature of the first set of conductive features, a first portion of the set of gates to a second portion of the set of gates,
wherein the first portion of the set of gates corresponds to a gate terminal of a first n-type transistor,
the second portion of the set of gates corresponds to a gate terminal of a first p-type transistor,
the first n-type transistor being part of a first transmission gate, and
the first p-type transistor being part of a second transmission gate.

2. The method of claim 1, wherein electrically coupling the first portion of the set of gates to the second portion of the set of gates comprises:
electrically coupling by at least a first via, the first conductive feature of the first set of conductive features to the first portion of the set of gates; and
electrically coupling by at least a second via, the first conductive feature of the first set of conductive features to the second portion of the set of gates.

3. The method of claim 1, further comprising:
positioning a third set of conductive features in the second direction, the third set of conductive features being in a third layer different from the first layer.

4. The method of claim 3, further comprising:
electrically coupling, by at least a first via, at least a first conductive feature of the third set of conductive features to at least a first conductive feature of the second set of conductive features; and
electrically coupling, by at least a second via, at least the first conductive feature of the second set of conductive features to at least a second conductive feature of the third set of conductive features.

5. The method of claim 4, wherein
the first conductive feature of the third set of conductive features corresponds to at least a drain terminal of the first p-type transistor or a source terminal of a second p-type transistor, and
the second conductive feature of the third set of conductive features corresponds to at least a drain terminal of the first n-type transistor or a source terminal of a second n-type transistor,
the second n-type transistor being part of the second transmission gate, and
the second p-type transistor being part of the first transmission gate.

6. The method of claim 4, further comprising:
electrically coupling, by at least a third conductive feature of the third set of conductive features, a drain terminal of a second p-type transistor to a source terminal of the first n-type transistor.

7. The method of claim 3, further comprising:
electrically coupling, by a first via, a first conductive feature of the second set of conductive features to a first conductive feature of the third set of conductive features; and
electrically coupling, by a second via, the first conductive feature of the second set of conductive features to a second conductive feature of the third set of conductive features, wherein
the first conductive feature of the third set of conductive features corresponds to at least a source terminal of a second p-type transistor, a drain terminal of the first n-type transistor or a source terminal of a second n-type transistor,
the second conductive feature of the third set of conductive features corresponds to at least a drain terminal of the first p-type transistor,
the first conductive feature of the third set of conductive features extends from an active region of the second p-type transistor to an active region of the first n-type transistor,
the second n-type transistor is part of the second transmission gate, and
the second p-type transistor is part of the first transmission gate.

8. The method of claim 7, further comprising:
electrically coupling, by a third via, a second conductive feature of the second set of conductive features to a third conductive feature of the third set of conductive features; and
electrically coupling, by a fourth via, the second conductive feature of the second set of conductive features to a fourth conductive feature of the third set of conductive features, wherein
the third conductive feature of the third set of conductive features corresponds to a drain terminal of the second n-type transistor.

9. The method of claim 1, further comprising:
electrically coupling a gate terminal of a second p-type transistor and a gate terminal of a second n-type transistor, the electrically coupling comprises:
positioning a third portion of the set of gates across an active region of the second p-type transistor and an active region of the second n-type transistor, the third portion corresponding to the gate terminal of the second p-type transistor and the gate terminal of the second n-type transistor, the second n-type transistor being part of the second transmission gate, and the second p-type transistor being part of the first transmission gate.

10. The method of claim 9, further comprising:
positioning a fourth portion of the set of gates across the active region of the second p-type transistor, the fourth portion of the set of gates corresponding to a first dummy transistor; and
positioning a fifth portion of the set of gates across the active region of the second n-type transistor, the fifth portion of the set of gates corresponding to a second dummy transistor.

11. The method of claim 1, further comprising:
electrically coupling a gate terminal of a second p-type transistor and a gate terminal of a second n-type transistor, the electrically coupling comprises:
electrically coupling by at least a first via, a second conductive feature of the first set of conductive features to a third portion of the set of gates; and
electrically coupling by at least a second via, the second conductive feature of the first set of conductive features to a fourth portion of the set of gates, the second n-type transistor being part of the second transmission gate, and the second p-type transistor being part of the first transmission gate.

12. An integrated circuit, comprising:
a first set of conductive traces in a first layer of the integrated circuit, the first set of conductive traces extending in a first direction;
a second set of conductive traces in a second layer of the integrated circuit different from the first layer, the second set of conductive traces extending in a second direction different from the first direction;
a gate terminal of a first p-type transistor comprising a first conductive trace of the second set of conductive traces;
a gate terminal of a first n-type transistor comprising a second conductive trace of the second set of conductive traces; and
a first via electrically coupled between a first conductive trace of the first set of conductive traces and the first conductive trace of the second set of conductive traces,
wherein the first conductive trace of the second set of conductive traces and the second conductive trace of the second set of conductive traces are aligned along a common axis, and
the first n-type transistor and the first p-type transistor being part of a first transmission gate.

13. The integrated circuit of claim 12, further comprising:
a gate terminal of a second p-type transistor comprising a third conductive trace of the second set of conductive traces; and
a gate terminal of a second n-type transistor comprising a fourth conductive trace of the second set of conductive traces, the second n-type transistor and the second p-type transistor being part of a second transmission gate.

14. The integrated circuit of claim 13, further comprising:
a second via coupled between the first conductive trace of the first set of conductive traces and the fourth conductive trace of the second set of conductive traces;
a third via coupled between a second conductive trace of the first set of conductive traces and the third conductive trace of the second set of conductive traces; and
a fourth via coupled between the second conductive trace of the first set of conductive traces and the second conductive trace of the second set of conductive traces.

15. The integrated circuit of claim 14, further comprising:
a fifth conductive trace of the second set of conductive traces is part of a first dummy transistor, and is aligned along another common axis with the third conductive trace of the second set of conductive traces.

16. The integrated circuit of claim 12, further comprising:
a third set of conductive traces extending in the first direction, the third set of conductive traces being in the first layer of the integrated circuit;
a fourth set of conductive traces extending in the second direction, the fourth set of conductive traces being in a third layer different from the first layer;
a second via coupled between a first conductive trace of the third set of conductive traces and a first conductive trace of the fourth set of conductive traces; and
a third via coupled between the first conductive trace of the third set of conductive traces and a second conductive trace of the fourth set of conductive traces,
wherein the first conductive trace of the fourth set of conductive traces corresponds to at least a source terminal of the first p-type transistor, a drain terminal of the first n-type transistor or a source terminal of a second n-type transistor,
the second conductive trace of the fourth set of conductive traces corresponds to at least a drain terminal of a second p-type transistor, and
the second n-type transistor and the second p-type transistor being part of a second transmission gate.

17. The integrated circuit of claim 16, further comprising:
a fourth via coupled between a second conductive trace of the third set of conductive traces and a third conductive trace of the fourth set of conductive traces; and
a fifth via coupled between the second conductive trace of the third set of conductive traces and a fourth conductive trace of the fourth set of conductive traces,
wherein the third conductive trace of the fourth set of conductive traces corresponds to a drain terminal of the second n-type transistor.

18. An integrated circuit, comprising:
a first PMOS transistor comprising a first gate, the first PMOS transistor being part of a first transmission gate;
a first NMOS transistor comprising a second gate, the first NMOS transistor being part of a second transmission gate;
a first dummy transistor;
a second dummy transistor;
a set of gates extending in a first direction in a first layer of the integrated circuit, a first gate portion of the set of gates extending across an active region of the first PMOS transistor and an active region of the first NMOS transistor, the first gate portion of the set of gates being the first gate of the first PMOS transistor and the second gate of the first NMOS transistor; and
a first set of conductive features extending in a second direction different from the first direction, and in a second layer of the integrated circuit different from the first layer.

19. The integrated circuit of claim 18, further comprising:
a second set of conductive features extending in the second direction and in the second layer of the integrated circuit;
a third set of conductive features extending in the first direction and in a third layer of the integrated circuit different from the first layer and the second layer;
a first via coupled between a first conductive feature of the third set of conductive features and a first conductive feature of the second set of conductive features; and
a second via coupled between a second conductive feature of the third set of conductive features and the first conductive feature of the second set of conductive features,
wherein a second gate portion of the set of gates is a gate of the first dummy transistor, and
a third gate portion of the set of gates is a gate of the second dummy transistor.

20. The integrated circuit of claim 18, further comprising:
a second PMOS transistor comprising a third gate, the second PMOS transistor being part of the second transmission gate;

a second NMOS transistor comprising a fourth gate, the second NMOS transistor being part of the first transmission gate;

a first via coupled between a second gate portion of the set of gates and a first conductive feature of the first set of conductive features, the second gate portion of the set of gates extending across an active region of the second PMOS transistor, and being the third gate of the second PMOS transistor; and a second via coupled between a third gate portion of the set of gates and the first conductive feature of the first set of conductive features, the third gate portion of the set of gates extending across an active region of the second NMOS transistor, and being the fourth gate of the second NMOS transistor.

\* \* \* \* \*